United States Patent
Dijkstra et al.

(10) Patent No.: US 7,518,442 B1
(45) Date of Patent: Apr. 14, 2009

(54) CIRCUIT AND METHOD FOR SUPPRESSING SWITCHING AND SUPPLY-RELATED ERRORS IN A PWM POWER STAGE BY INSTANTANEOUS PER-PULSE FEEDBACK

(75) Inventors: Gerrit Dijkstra, Pijnacker (NL); Frank Kuijstermans, Leiderdorp (NL)

(73) Assignee: National Semiconductor Corporation, Santa Clara, CA (US)

( * ) Notice: Subject to any disclaimer, the term of this patent is extended or adjusted under 35 U.S.C. 154(b) by 99 days.

(21) Appl. No.: 11/548,240

(22) Filed: Oct. 10, 2006

(51) Int. Cl.
*H03F 3/38* (2006.01)
(52) U.S. Cl. .................................. 330/10; 330/251
(58) Field of Classification Search .......... 330/10, 330/251, 207 A
See application file for complete search history.

(56) References Cited

U.S. PATENT DOCUMENTS

| | | | |
|---|---|---|---|
| 5,805,020 A * | 9/1998 | Danz et al. | 330/10 |
| 6,307,431 B1 | 10/2001 | Botti et al. | |
| 6,577,186 B2 * | 6/2003 | Berkhout | 330/10 |
| 6,998,911 B2 * | 2/2006 | Honda et al. | 330/10 |
| 7,295,063 B2 * | 11/2007 | Kurokawa | 330/10 |

OTHER PUBLICATIONS

Nielsen, "PEDEC-A Novel Pulse Referenced Control Method for High Quality Digital PWM Switching Power Amplification," *Power Electronics Specialists Conference 1998. PESC 98. 29th Annual IEEE* (1): 200-207, May 17-22, 1998.

Park et al., "A novel controller for switching audio power amplifier with digital input," *Power Electronics Specialists Conference, 2002. PESC 02. 33rd Annual IEEE* (1): 39-44, Jun. 23-27, 2002.

* cited by examiner

*Primary Examiner*—Henry K Choe
(74) *Attorney, Agent, or Firm*—Darby & Darby P.C.; Matthew M. Gaffney

(57) ABSTRACT

A class D amplifier is provided. The class D amplifier includes a modulator and a class D power stage. The modulator provides a PWM output signal to the class D power stage. For each pulse of the PWM input signal, the class D amplifier provides a corresponding pulse in the PWM output signal, such that the pulse is terminated when the area under the pulse of the output of the class D power stage is substantially equal to the area under the pulse of the corresponding PWM input signal. In this way, the class D amplifier provides instantaneous per-pulse PWM feedback.

21 Claims, 24 Drawing Sheets

Figure 7A  PWM_in 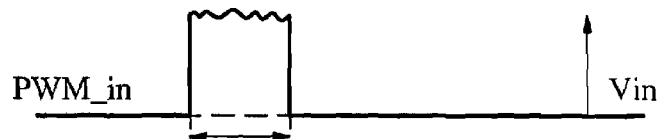 Vin
Figure 7B  PWM_ref  Vref
Figure 7C  Iup 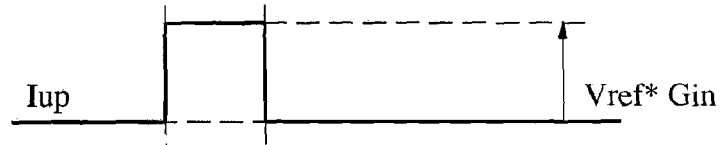 Vref* Gin
Figure 7D  Vint 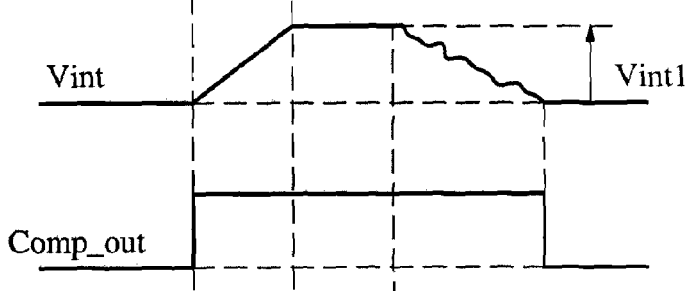 Vint1
Figure 7E  Comp_out 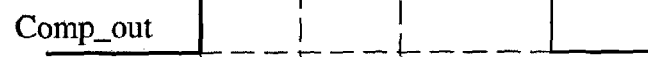
Figure 7F  PWM_out  Vdd
Figure 7G  Idown 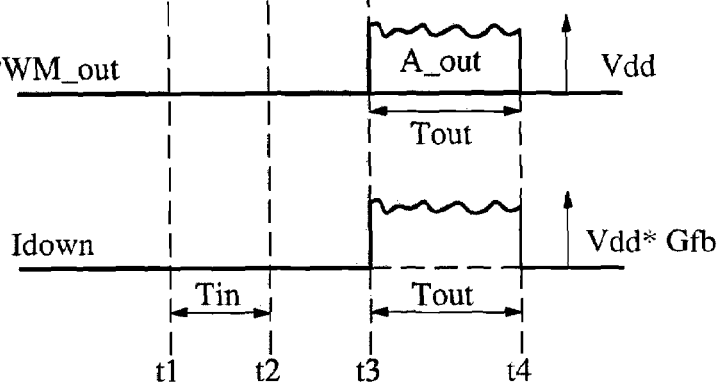 Vdd* Gfb

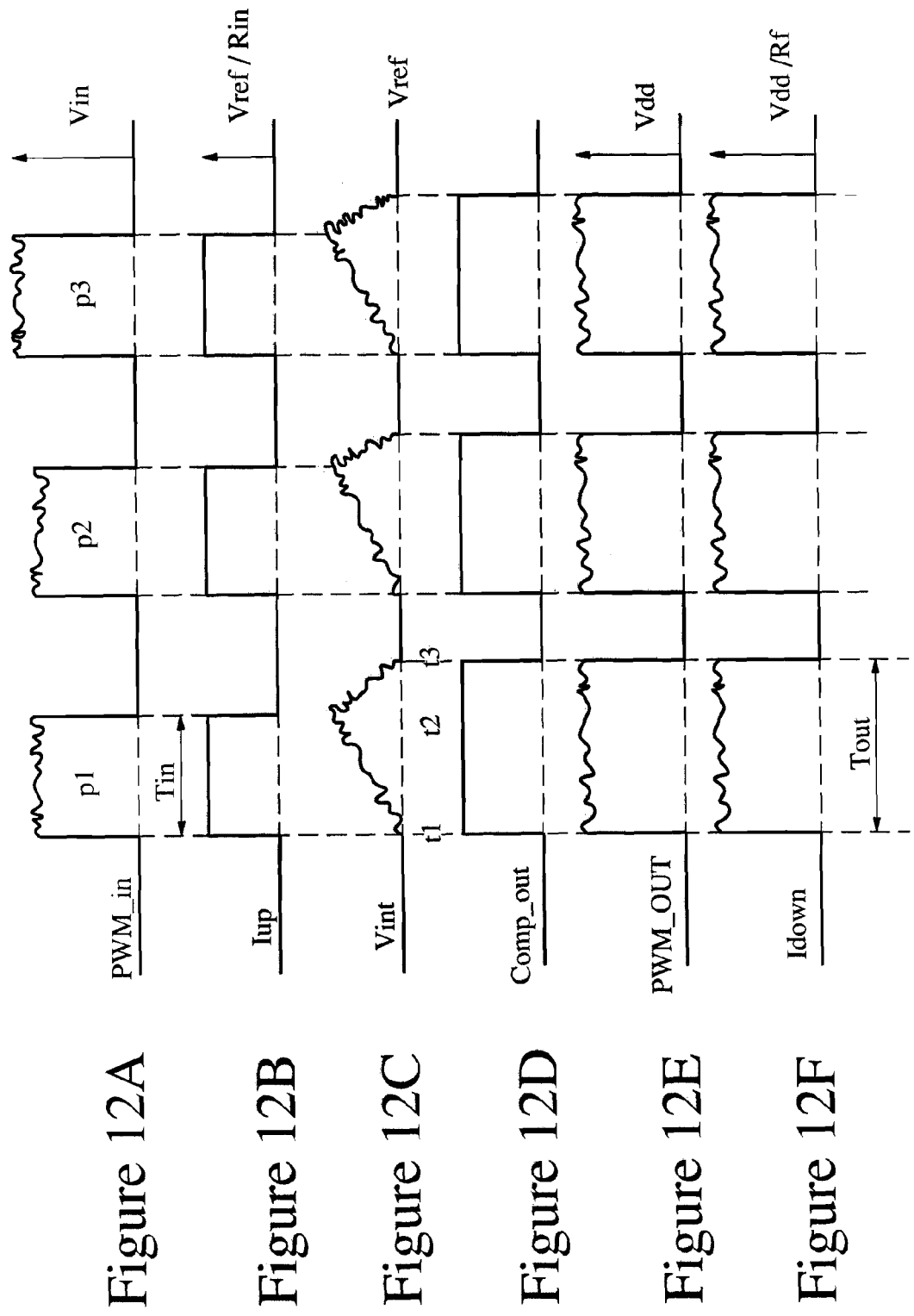

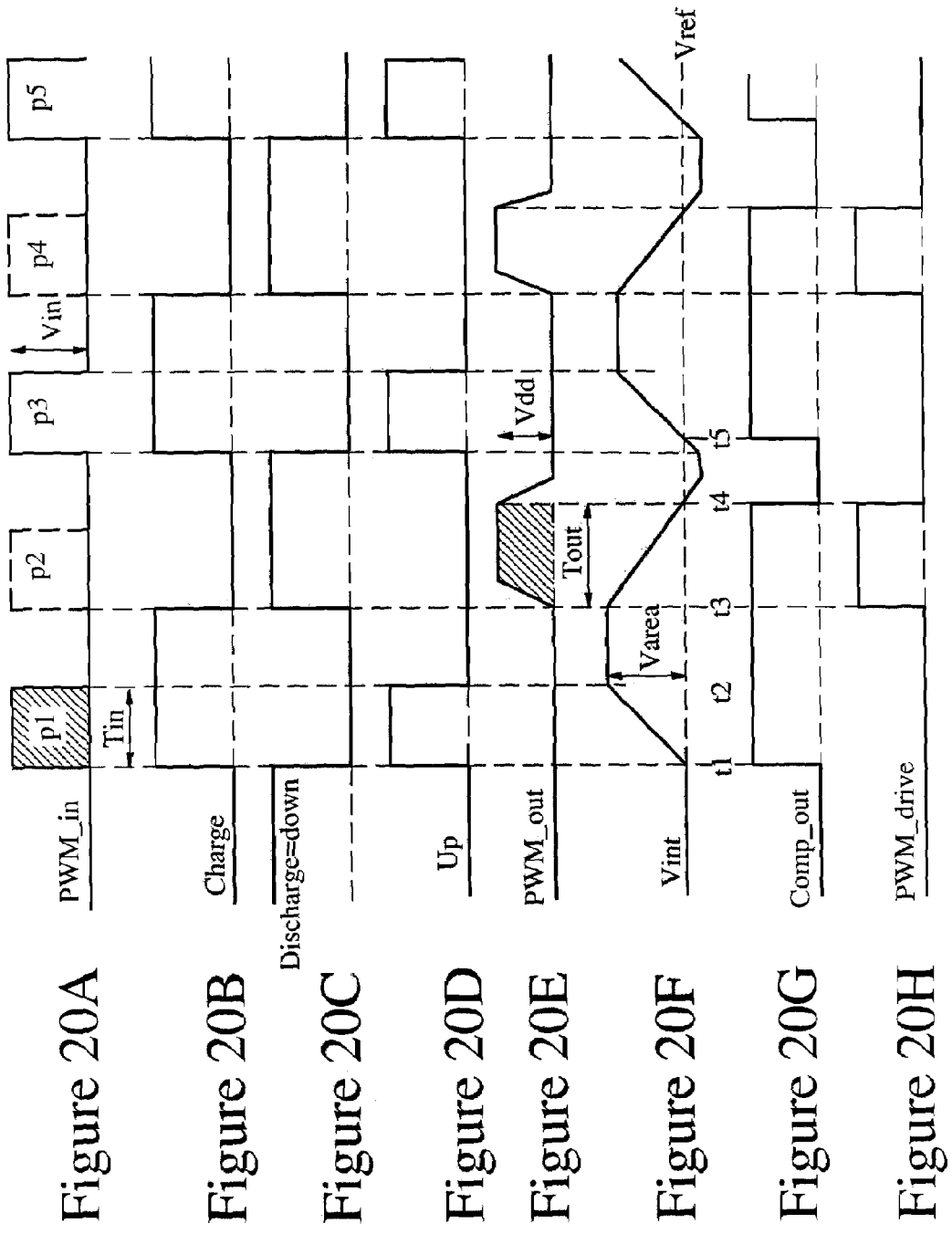

CIRCUIT AND METHOD FOR SUPPRESSING SWITCHING AND SUPPLY-RELATED ERRORS IN A PWM POWER STAGE BY INSTANTANEOUS PER-PULSE FEEDBACK

FIELD OF THE INVENTION

The invention is related to class D amplifiers, and in particular but not exclusively, to a circuit method and circuit for suppressing switching and supply-related errors in a PWM power stage by instantaneous per-pulse feedback.

BACKGROUND OF THE INVENTION

In audio applications, a power amplifier is usually incorporated to drive a speaker load. The speaker load value typically varies from 4 ohm to 32 ohm. Traditionally, class AB amplifiers have been used to drive the speaker load.

The main drawback of using class AB amplifiers is low efficiency. Low efficiency translates into more power dissipation inside the amplifier which in turn mandates using a (larger) heat sink to dissipate the heat and also lowers the battery life or necessitates a larger and more expensive power supply. This increases the cost and the area of the audio solution.

A class-D amplifier is attractive because of the higher power efficiency compared to a class AB amplifier, which realizes a longer battery life and eliminates the heat sink requirement. This allows design of compact and low cost multi-channel high-power systems. The class D amplifiers partially mitigate the concern of thermal runaway by using transistors as switches.

Class D amplifiers typically employ either pulse-width modulation or pulse density modulation. The relatively high frequency carrier signal is modulated by the relatively low frequency audio input signal. This modulated signal is applied to the speaker by power transistors which are either completely on or completely off. This way the power dissipation is minimal inside these power transistors.

BRIEF DESCRIPTION OF THE DRAWINGS

Non-limiting and non-exhaustive embodiments of the present invention are described with reference to the following drawings, in which:

FIGS. 7A-7G show timing diagrams of waveforms of embodiments of signals for an embodiment of the circuit of FIG. 6;

FIGS. 12A-F illustrate timing diagrams of examples of ideal signals for the circuit of FIG. 11;

FIGS. 20A-H illustrate timing diagrams of waveforms of embodiments of signals for an embodiment of the circuit of FIG. 18;

DETAILED DESCRIPTION

Figure 1:
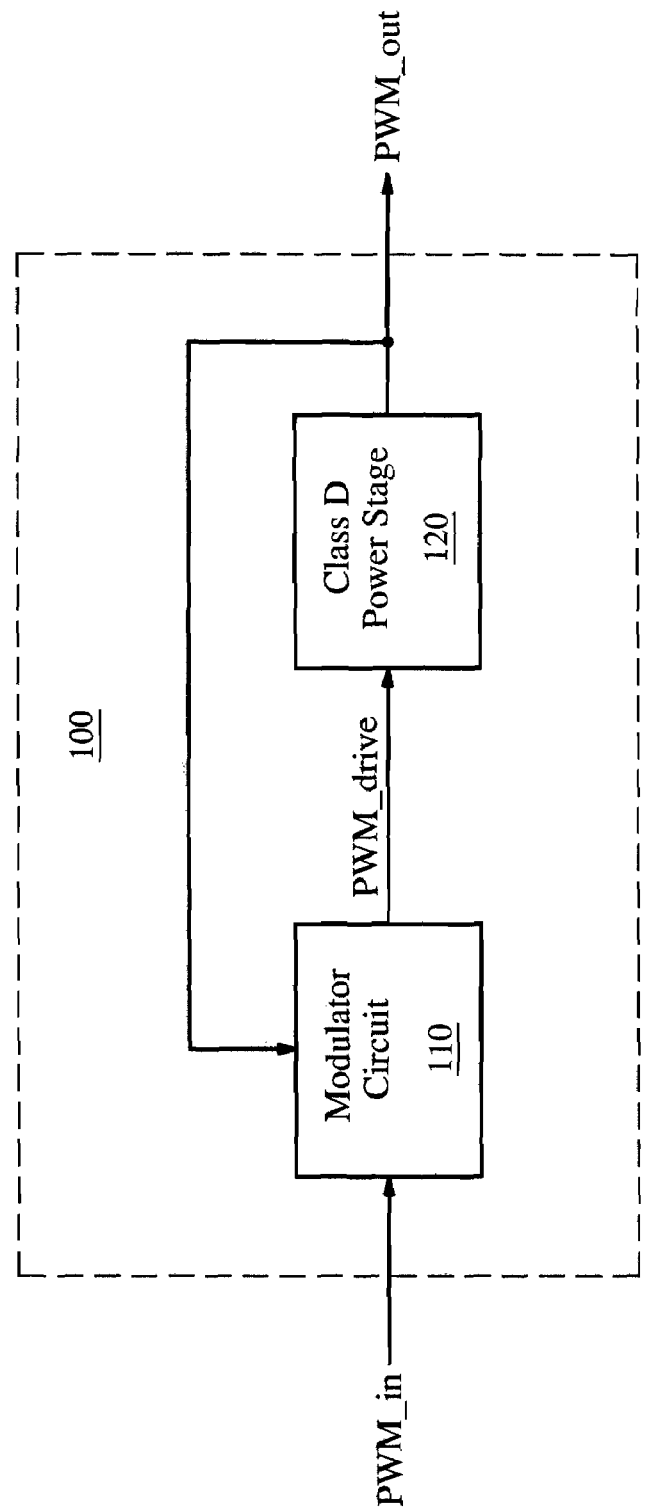
FIG. 1 shows a block diagram of an embodiment of a class D amplifier.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a class D amplifier. The class D amplifier includes a modulator and a class D power stage. The modulator provides a PWM output signal to the class D power stage. For each pulse of the PWM input signal, the class D amplifier provides a corresponding pulse in the PWM output signal, such that the pulse is terminated when the area under the pulse of the output of the class D power stage is substantially equal to the area under the pulse of the corresponding PWM input signal. In this way, the class D amplifier provides instantaneous per-pulse PWM feedback.

FIG. 1 shows a block diagram of an embodiment of class D amplifier 100, which includes modulator circuit 110 and class D power stage 120.

Class D amplifier 100 operates as follows. Modulator circuit 110 provides signal PWM_drive from signal PWM_in. In one embodiment, signal PWM_in may be either a PWM signal or an analog signal that is subsequently combined with a constant duty cycle clock signal. In another embodiment, signal PWM_in may only be a PWM signal.

Class D power stage 120 is arranged to provide signal PWM_out from signal PWM_drive. Class D power stage 120 may be interchangeably referred to as a class D output stage, a class D output driver, or the like. Modulator circuit 110 provides signal PWM_drive such that signal PWM_drive is a PWM signal with instantaneous per-pulse feedback, where the feedback is provided based on signal PWM_out. The feedback corrects for errors in class D power stage 120, and the like.

Instantaneous per-pulse feedback means that errors in a given pulse of signal PWM_in pulse are corrected in that pulse. For example, a rise time is required for a pulse to go from low to high. This rise-time may cause the corresponding pulse in signal PWM_out to be shorter than it should be. However, in one embodiment, this error is corrected by causing the corresponding pulse in signal PWM_drive to become longer to account for the error caused by the rise time.

In one embodiment, some of the feedback is instantaneous per-pulse feedback, and some of the feedback occurs in a subsequent pulse. For example, in one embodiment, falltime errors are corrected for in a subsequent pulse, and all other error are corrected in the pulse in which they occur, as discussed below with regard to FIG. 8C, which also shows various errors that are corrected for in one embodiment.

As stated above, in one embodiment class D amplifier 100 is capable is processing either a PWM signal or an analog input signal.

Conventionally, the output of digital signal processing requires digital-to-analog (D/A) conversion, followed by analog amplification. However, power amplification may be achieved without D/A conversion, for example by performing pulse code modulation (PCM)/PWM conversion of the digital audio source, followed by PWM power amplification. However, the PWM signal is sensitive to jitter and other errors. Conventional feedback correction is not applicable for error correction since there is no analog reference.

Class D amplifier 100 is capable of receiving a PWM signal and providing per-pulse instantaneous feedback to provide error correction.

Figure 2:
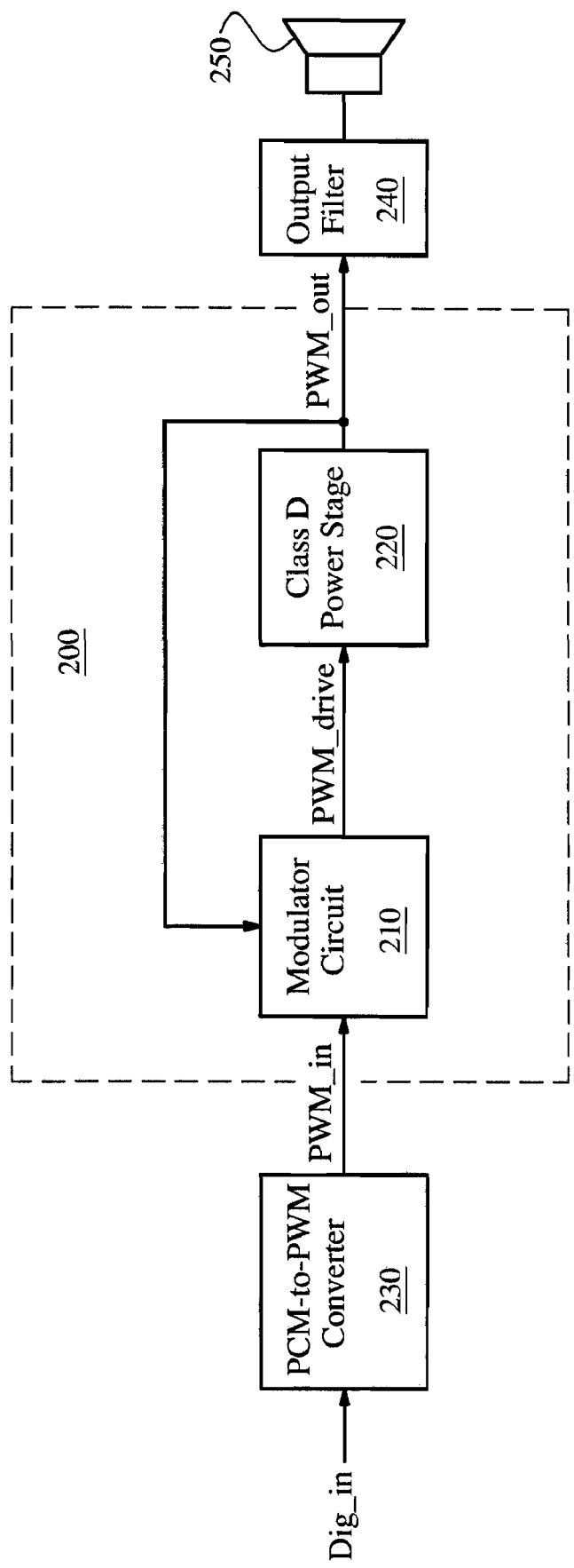
FIG. 2 illustrates a block diagram of an embodiment of the class D amplifier of FIG. 1 and external circuitry.

FIG. 2 illustrates a block diagram of an embodiment of class D amplifier 200 and external circuitry. The external circuitry includes PCM-to-PWM converter 230, output filter 240, and speaker 250. Class D amplifier 200 may be employed as an embodiment of class D amplifier 100 of FIG. 1.

In operation, PCM-to-PWM converter 230 performs PCM-to-PWM conversion on digital input signal Dig_in to provide signal PWM_in. Class D amplifier 200 provides signal PWM_out from signal PWM_in. Output filter 240 provides output filtering, and the output of output filter 240 drives speaker 250.

Although a single-ended embodiment is illustrated in FIG. 2, in other embodiments, a bridge-tied load (BTL) configuration may be employed.

Figure 3:
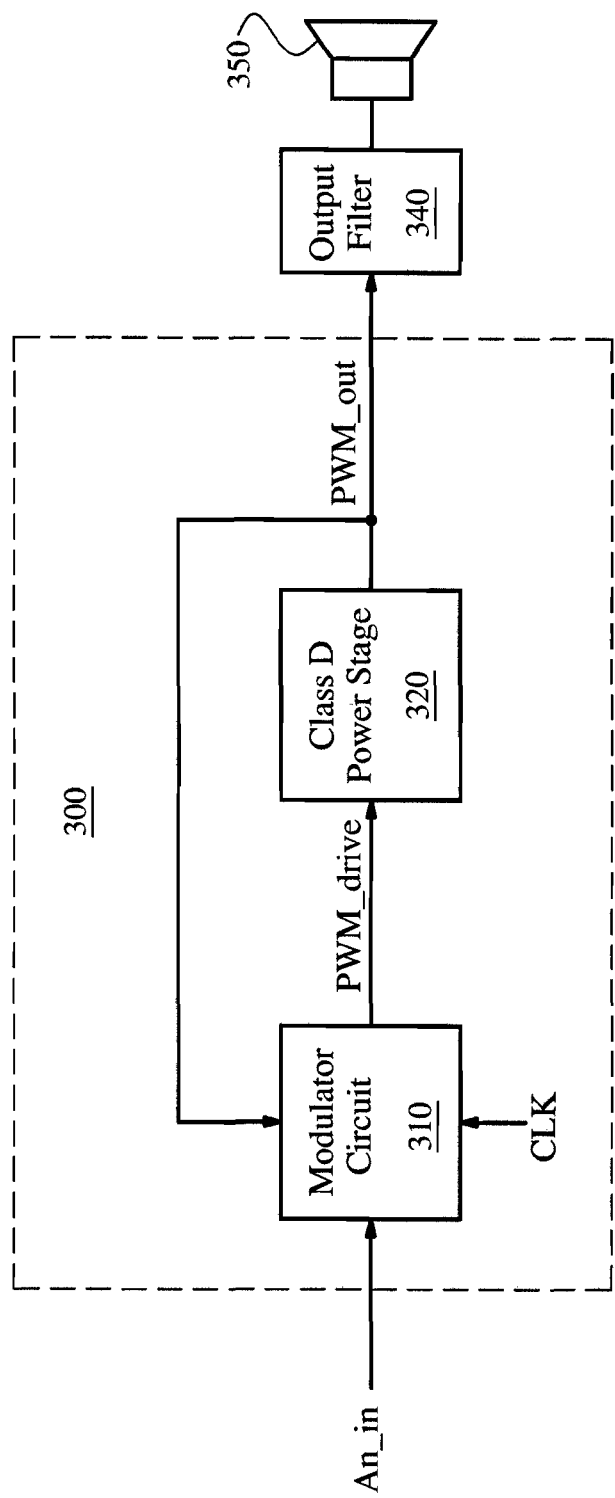
FIG. 3 shows a block diagram of another embodiment of the class D amplifier of FIG. 1 and external circuitry.

FIG. 3 shows a block diagram of an embodiment of class D amplifier 300 and external circuitry. The external circuitry includes output filter 340 and speaker 350. Class D amplifier 300 may be employed as an embodiment of class D amplifier 100 that is capable of handing an analog input signal An_in. As previously discussed, signal An_in is an embodiment of signal PWM_in that is combined with constant duty cycle clock signal CLK.

Although not shown, one embodiment of class D amplifier 100 includes both PCM-to-PWM converter 230 of FIG. 2 for use with digital signals, as well as the capability of receiving an analog signal that is combined with a constant duty cycle clock signal (as in FIG. 3). Further, although not shown, in other embodiment signal PWM_in may also be provided by pulse-width modulation of an analog input signal, instead of or in addition to the other methods.

Figure 4:
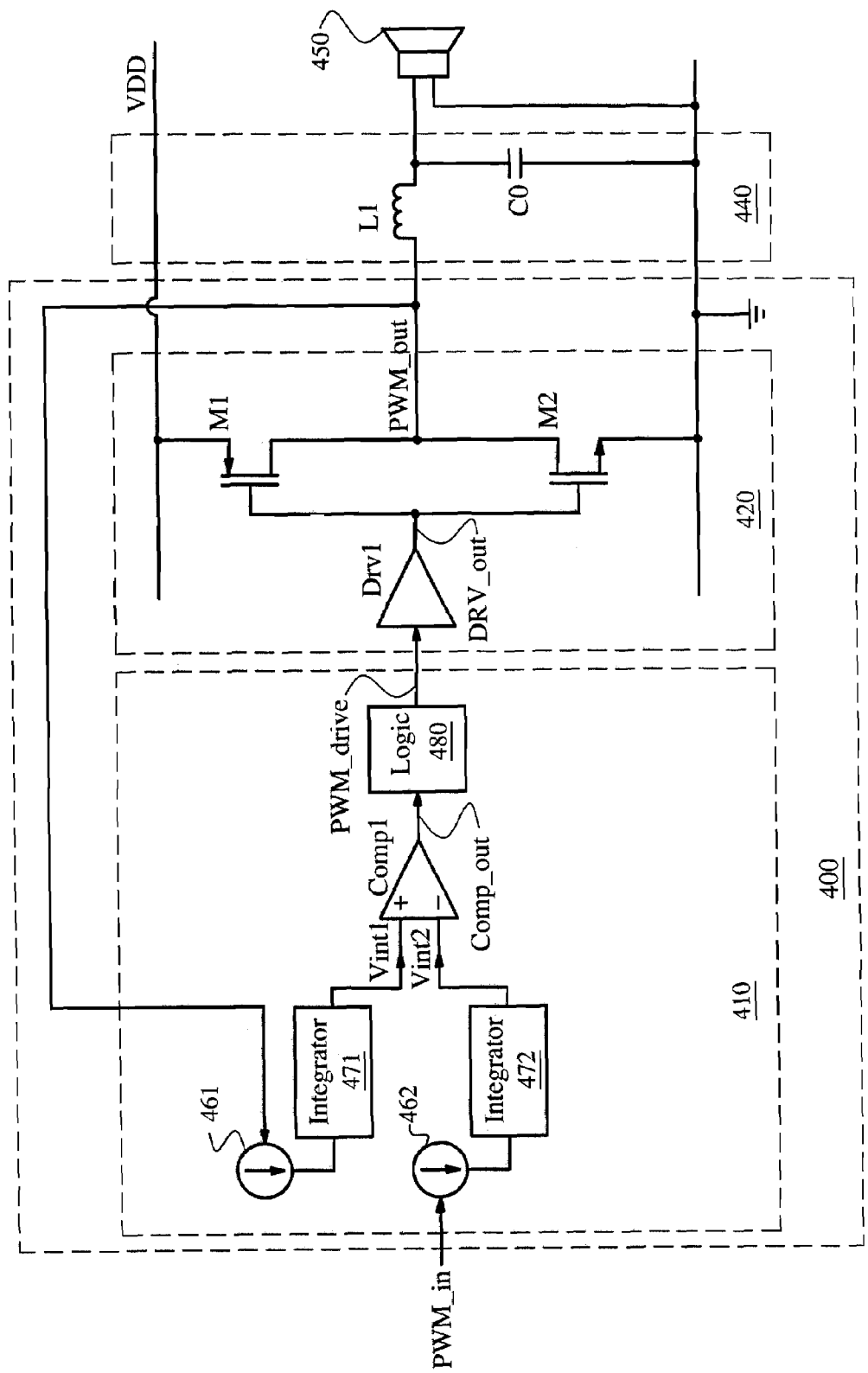
FIG. 4 illustrates a block diagram of an embodiment of the class D amplifier of FIG. 1, 2, or 3 above and external circuitry.

FIG. 4 illustrates a block diagram of an embodiment of class D amplifier 400 and external circuitry. The external circuitry may include output filter 440 and speaker 450. Class D amplifier 400 and external circuitry may be employed as embodiments of similarly-named parts in FIGS. 1-3 above. Class D power stage 420 includes driver Drv1, switch transistor M1, and switch transistor M2. Output filter 440 includes inductor L1 and capacitor C0. Modulator circuit 410 includes current source 461, current source 462, integrator 471, integrator 472, comparator Comp1, and logic block 480.

In operation, current source 461 provides a current that is based, in part, on signal PWM_out to the node at the input of integrator 471. Current source 462 is arranged to provide a current that is based, in part, on signal PWM_in to the node at the input of integrator 472. Integrator 471 is arranged to provide integration voltage Vint1, and integrator 472 is arranged to provide integration voltage Vint2. Comparator Comp1 is arranged to provide comparator output signal comp_out based on a comparison of signal Vint1 with signal Vint2. Essentially, comparator Comp1 compares the area under each pulse of signal PWM_out with the area under each corresponding pulse of signal PWM_in. Logic block 480 is arranged to provide signal PWM_drive based, in part, on signal comp_out.

Driver Drv1 is arranged to drive switch transistors M1 and M2. In one embodiment, driver Drv1 includes a group of cascaded inverters, and may further include additional circuitry to set or control the dead zone of the driver. Transistors M1 and M2 are power transistors that operate as switches. Inductor L1 and capacitor C0 form an LC output filter that performs a voltage averaging function.

Figure 5:
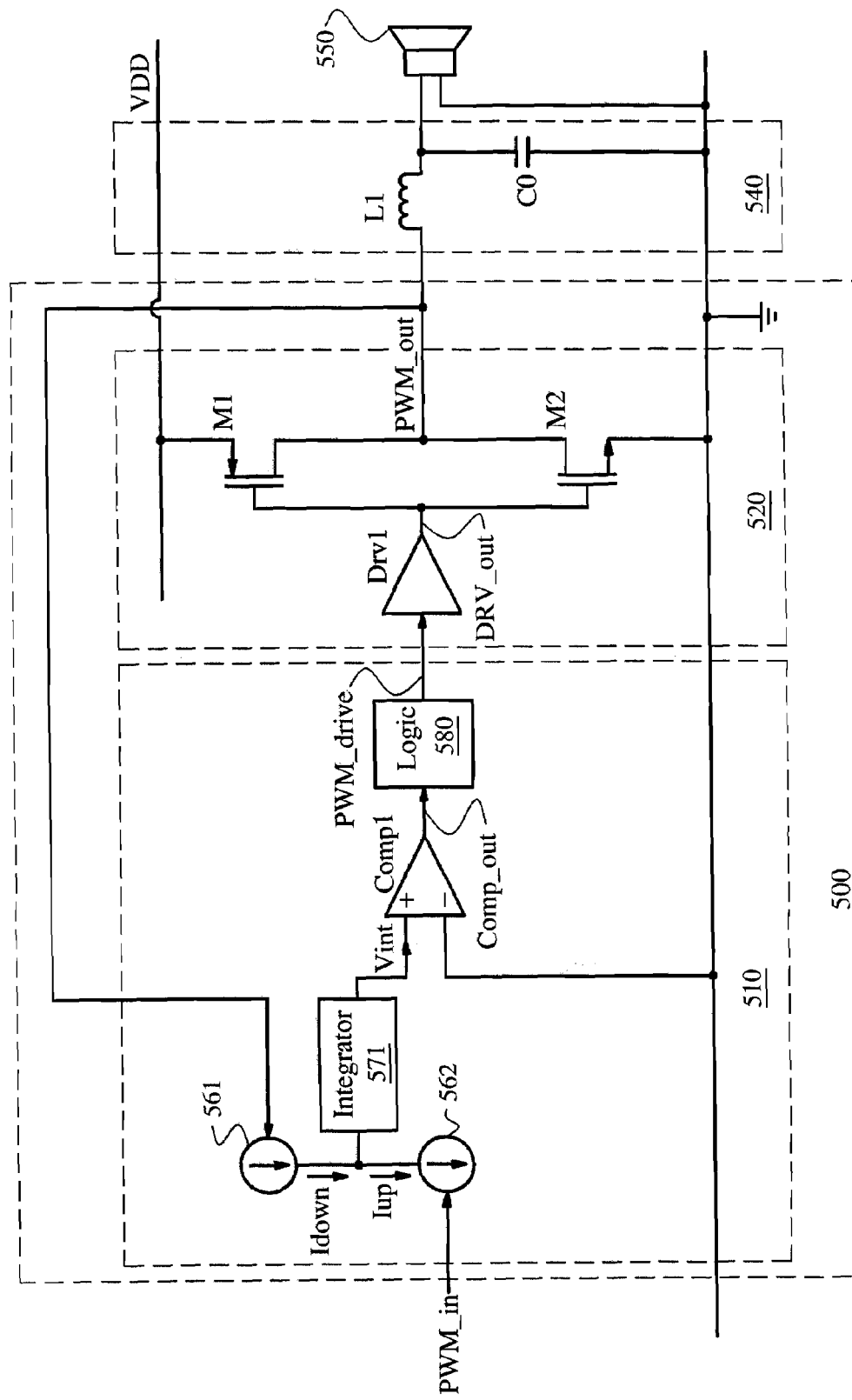
FIG. 5 shows a block diagram of another embodiment of the class D amplifier and external circuitry of FIG. 4.

FIG. 5 illustrates a block diagram of an embodiment of class D amplifier 500 and external circuitry. The circuitry of FIG. 5 is similar to the circuitry of FIG. 4, albeit different in some ways. Instead of two integrators, modulator 510 includes one integrator (571); current sources 561 and 562 each provide a current to the node at the input of integrator 571. Because of the opposite directions of the current Iup and Idown, one increases the integrator voltage Vint and the other deceases voltage Vint.

An ideal PWM signal is essentially digital in amplitude. The PWM signal is either high or low. All information is in the time domain. This means the PWM signal is not sensitive to amplitude noise but it is sensitive to noise in the time domain, commonly called jitter. This is the main difference with an actual digital signal which is digital in amplitude and discrete (synchronous) in time. Noise in time domain can be filtered from the actual digital signal by retiming it. This is not possible with a PWM signal.

When an ideal PWM signal is low-pass filtered, for example to drive a loudspeaker, the amplitude of the resulting analog signal is proportional to the duty-cycle of the PWM signal. But real life PWM signals are of course not ideal. The high and low levels are never perfectly constant but will be noisy. This can be due to supply variation, ground noise and varying drop across the output transistors, for example. Furthermore, the switching between high and low is not ideal and may show some overshoot, and it will have some delay and a certain rise and fall time. All these effects, and more, can distort the output signal. Output noise due to a noisy supply is expressed in the PSRR, the power supply rejection ratio. Distortion due to all other effects, but mainly the limited switching speed, shows in the total harmonic distortion (THD) specification of the power stage. THD is important especially for a power stage of an audio amplifier. By careful design, the switching times and thus THD can be minimized, and open loop operation may provide sufficient THD performance. The faster switching will however increase the electro-magnetic interference (EMI). This can cause serious problems because of EMI compliance regulations. Furthermore, when operating in open loop the power stage will be very sensitive to supply variation. This means the open loop power stage requires a very constant supply voltage. This is possible but costly. By employing class D amplifier 500 of FIG. 5, it is possible to relatively minimize both THD and EMI, as well as to achieve relatively high PSRR, accordingly not requiring a costly power supply.

Figure 6:
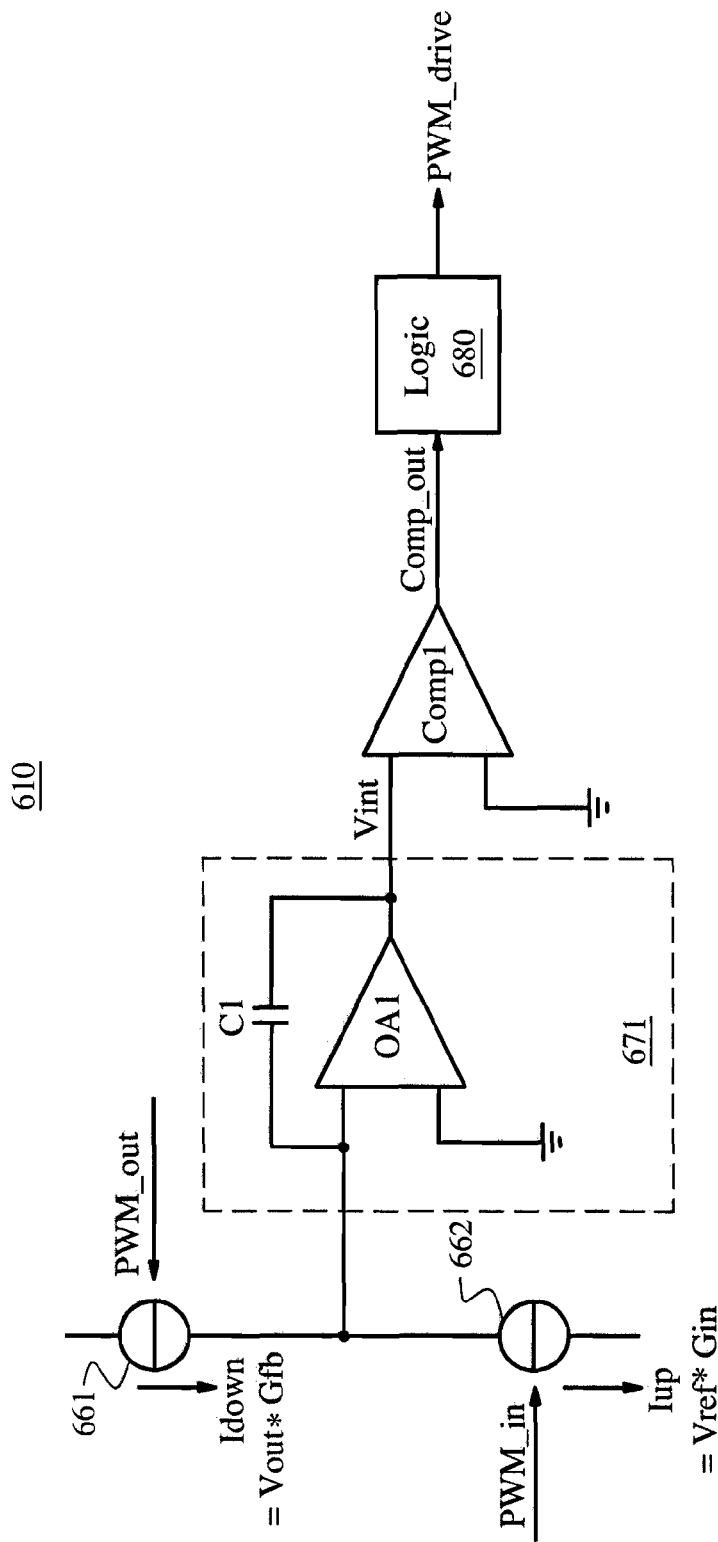
FIG. 6 illustrates a block diagram of an embodiment of the modulator of FIG. 5.

FIG. 6 illustrates a block diagram of an embodiment of modulator 610, which may be employed as an embodiment of modulator 510 of FIG. 5. Integrator 671 includes op amp OA1 and capacitor C1.

In the case where signal PWM_in is a PWM signal, the area of the output pulse PWM_out is compared with that of the corresponding input pulse PWM_in. All information of the input signal PWM_in is in the time domain—the time Tin or the duty-cycle of the PWM_in signal. This means there is no need to measure the area of the actual PWM_in pulse in this embodiment. The amplitude may not be very accurate and contain noise. In one embodiment of the present invention, the area of the actual PWM_in pulse is used. However, in a preferred embodiment, Vref is used. It is more accurate to use a constant amplitude Vref instead of the varying amplitude Vin. This results in the signal PWM_ref. The feedback matches the areas of both PWM_ref and PWM_out pulses so A_out=gain*A_in. Measuring the area A_in of this PWM_ref pulse is done by integrating the current Iup. This current Iup may be obtained from the reference voltage Vref and a transconductance Gin so Iup=Vref*Gin.

FIGS. 7A-7G show timing diagrams of waveforms of embodiments of signals for an embodiment of modulator 610 of FIG. 6.

During the time of the input pulse, from t1 to t2, the integrator voltage Vint increases from 0 to Vint1. The change of integrator voltage, Vint1, is a measure of the area of the pulse A_in. After A_in is measured, the area of the output pulse A_out is measured. At a certain time t3 the output pulse PWM_out is started. This PWM_out voltage results in a current Idown=Vdd*Gfb. The supply voltage Vdd may vary and may contain noise as indicated in FIG. 7F. So the current Idown varies with Vdd. At time t4, integrator voltage Vint has returned from Vint1 back to 0 and the comparator output comp_out changes to low. Signal comp_out is used to stop the output pulse PWM_out. At this time (t4), the ratio of A_out and A_in equal the gain that is set by Gin and Gfb. Accordingly, A_out/A_in=gain=Gin/Gout.

Figures 8A, 8B, 8C:
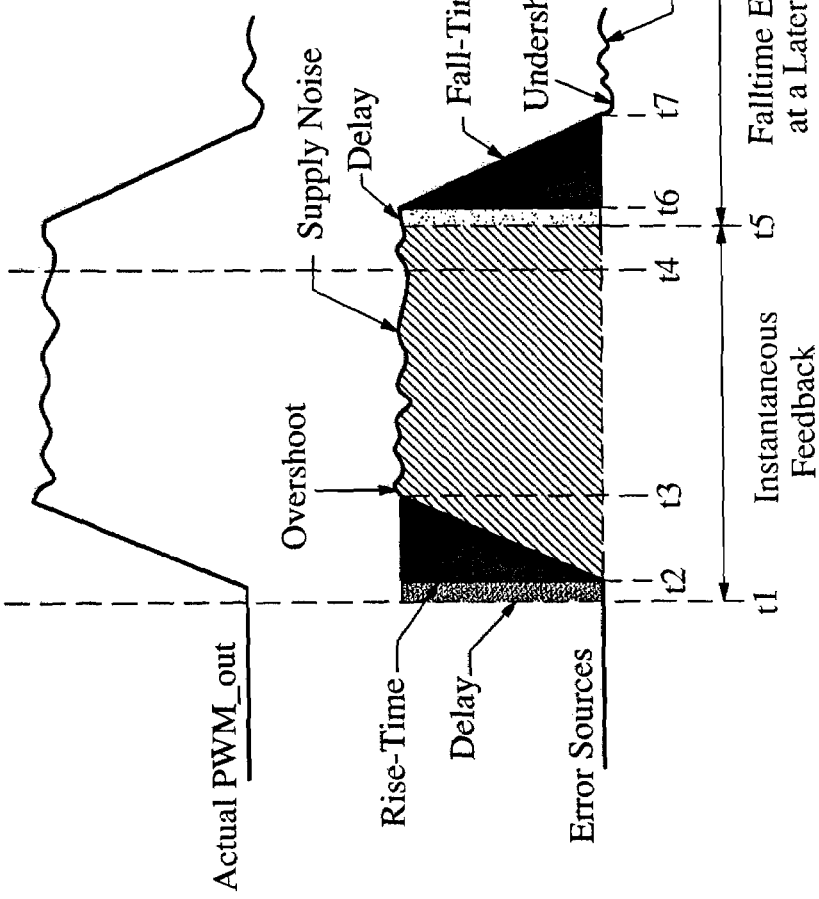
FIGS. 8A-C illustrate timing diagrams of waveforms of embodiments of signals for an embodiment of the circuit of FIG. 1.

FIGS. 8A-C illustrate timing diagrams of waveforms of embodiments of signals for an embodiment of the circuit of FIG. 1.

FIG. 8A shows the ideal PWM_out signal and FIG. 8B shows an embodiment of an actual signal from the power stage. The most important errors are shown in FIG. 8C. The first error shown is the delay time between t1 and t2. The second error made is the rise time from t2 to t3 causing an error in pulse area shown. After t3 there may be some overshoot and there may also be some noise or ripple on the supply voltage. All of these errors are compensated by the instantaneous feedback by extending the output pulse from t4 to t5. At that time t5 the area of the output pulse (dashed) is correct. This means that the integrator voltage is back at the starting level, the comparator will switch and the output pulse will be switched low. The actual output pulse will start switching low after a certain delay, at time t6. It then switches low with a certain fall-time, the time from t6 and t7. The feedback will also compensate the errors made after t5, like the delay, the fall-time, possible undershoot and ground noise. This total error is referred to herein as the falltime error. This falltime error is not corrected instantaneously but at the next PWM output pulse (or the next PWM output pulse associated with that integrator, for time-multiplexed embodiment as described in greater detail below). This error varies only slightly from pulse to pulse. This means that the correction information obtained from the previous pulse is very close to the correction that is actually required for the current output pulse.

Figure 9:
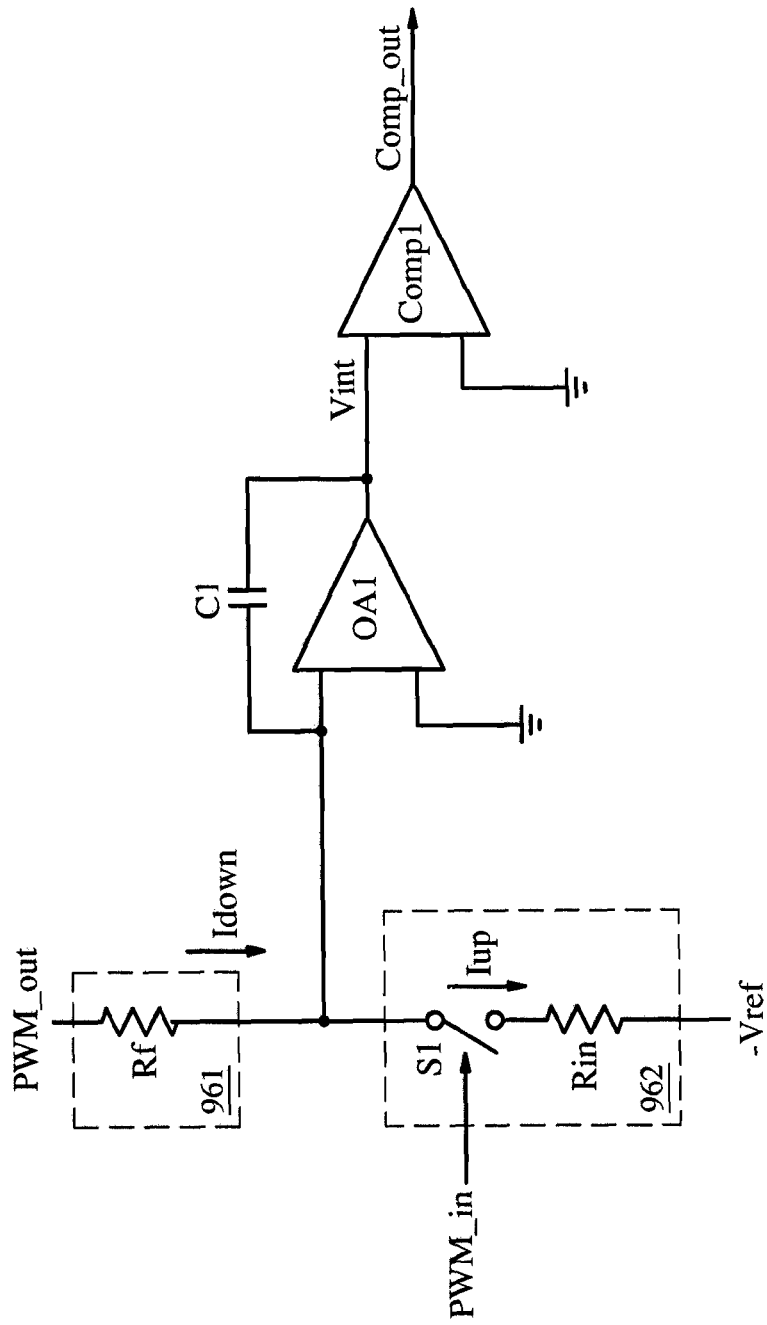
FIG. 9 shows a block diagram of an embodiment of a portion of the circuit of FIG. 6.
Figure 10:
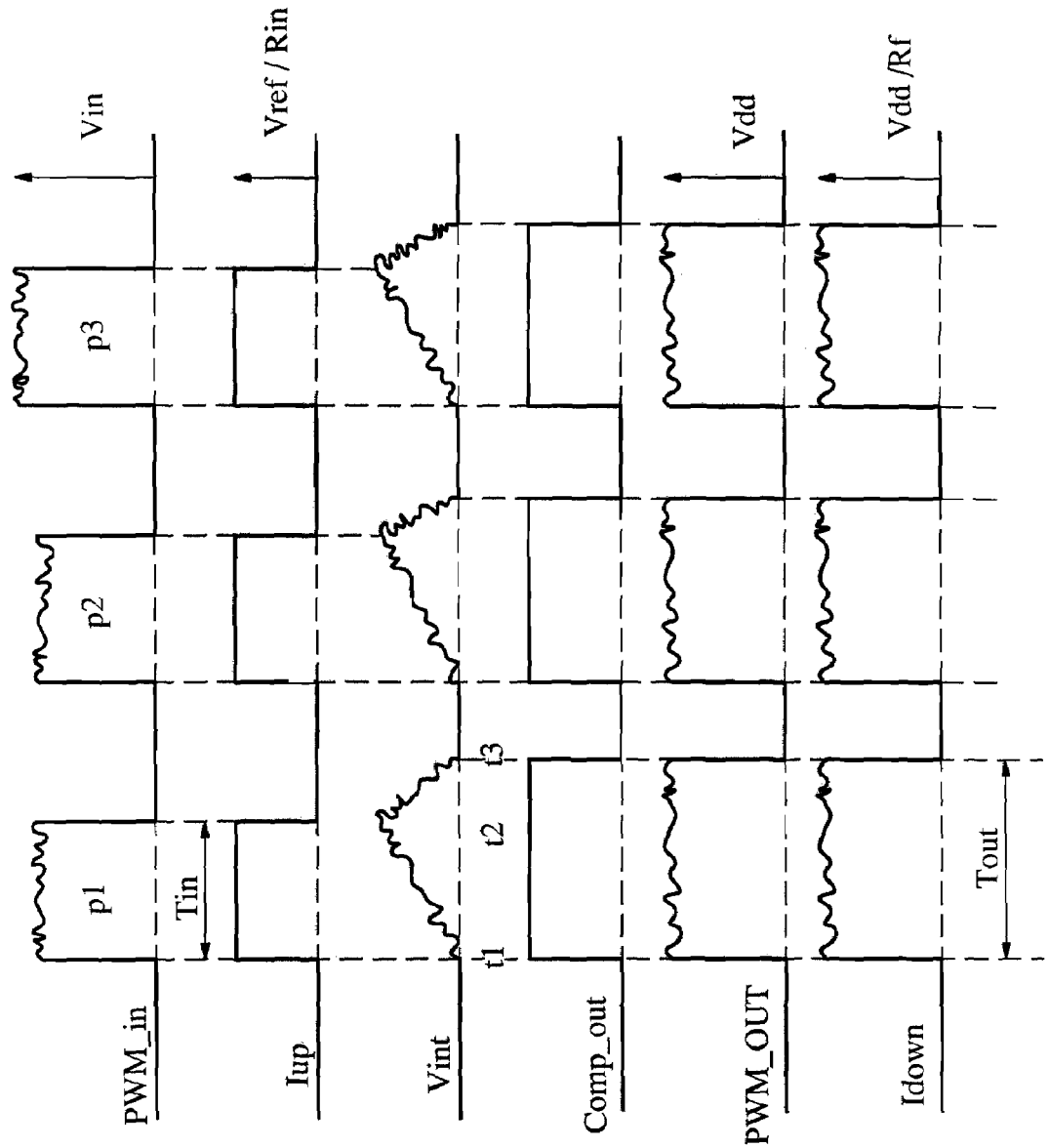
FIGS. 10A-10F illustrate timing diagrams of waveforms of examples of ideal signals for an embodiment of the circuit of FIG. 9.

FIG. 9 shows a block diagram of an embodiment of a portion (915) of an embodiment of modulator 610 of FIG. 6. Current source 961 includes resistor Rf. Current source 962 includes resistor Rin and switch S1.

Both integrator op amp OA1 and comparator Comp1 are referred to ground. Accordingly, when PWM_in is high, switch S1 is closed and current Iup=Vref/Rin. Feedback resistor Rf connects to the output, so ideally there is only current Idown when PWM_out is high, Idown=Vdd/Rf.

FIGS. 10A-10F illustrate timing diagrams of waveforms of examples of ideal signals for an embodiment of portion 915 of FIG. 9. The output pulse is started at the same time as the input pulse. From time t1 to t2, both Iup and Idown are integrated, so effectively Iup-Idown is integrated. At time t2, switch S1 is opened and only current Idown is flowing. At time t3, the integrator voltage is back at 0, comparator output signal comp_out switches low, and the output pulse PWM_out is switched low.

Figure 11:
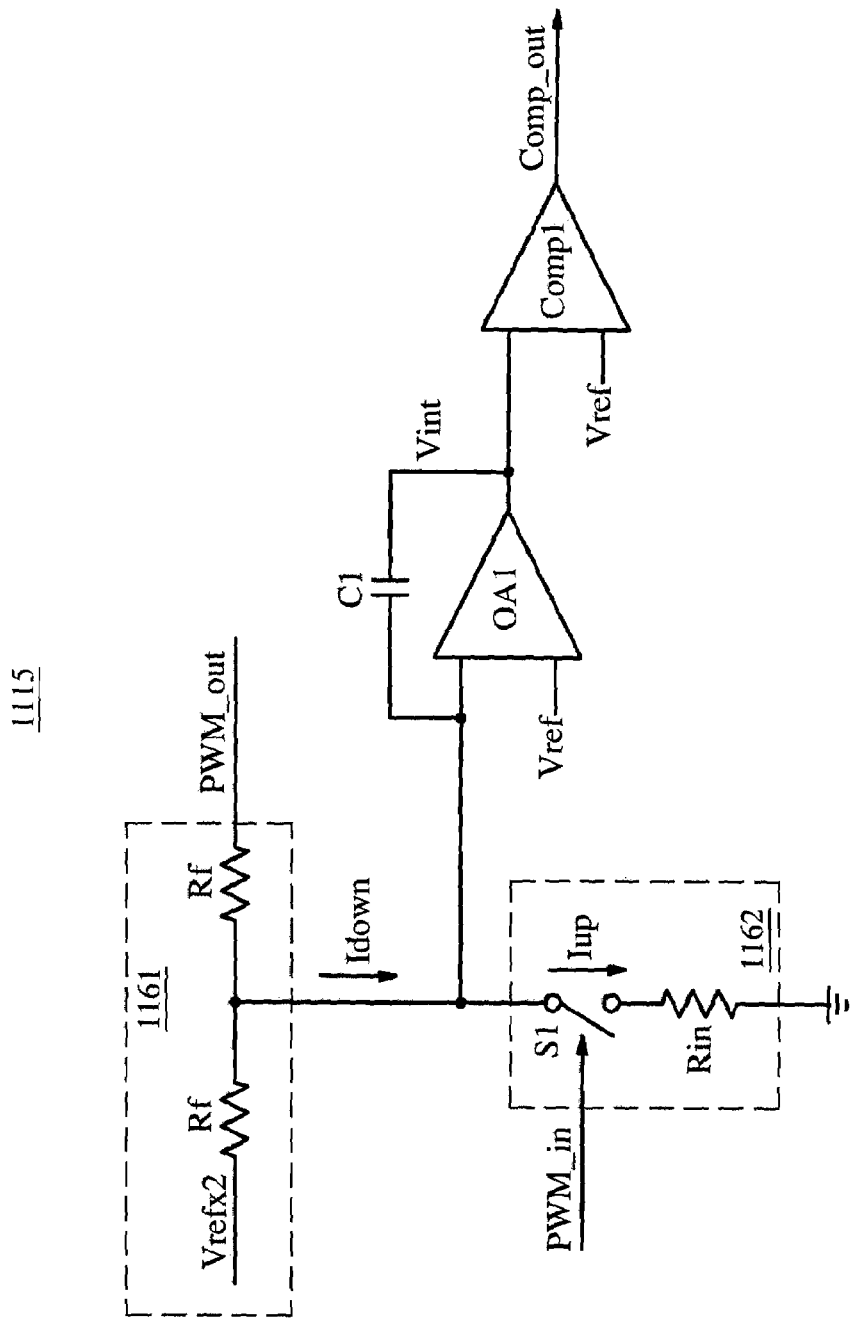
FIG. 11 shows a block diagram of another embodiment of the portion of the circuit of FIG. 6.
Figures 13A, 13B, 13C, 13D, 13E, 13F:
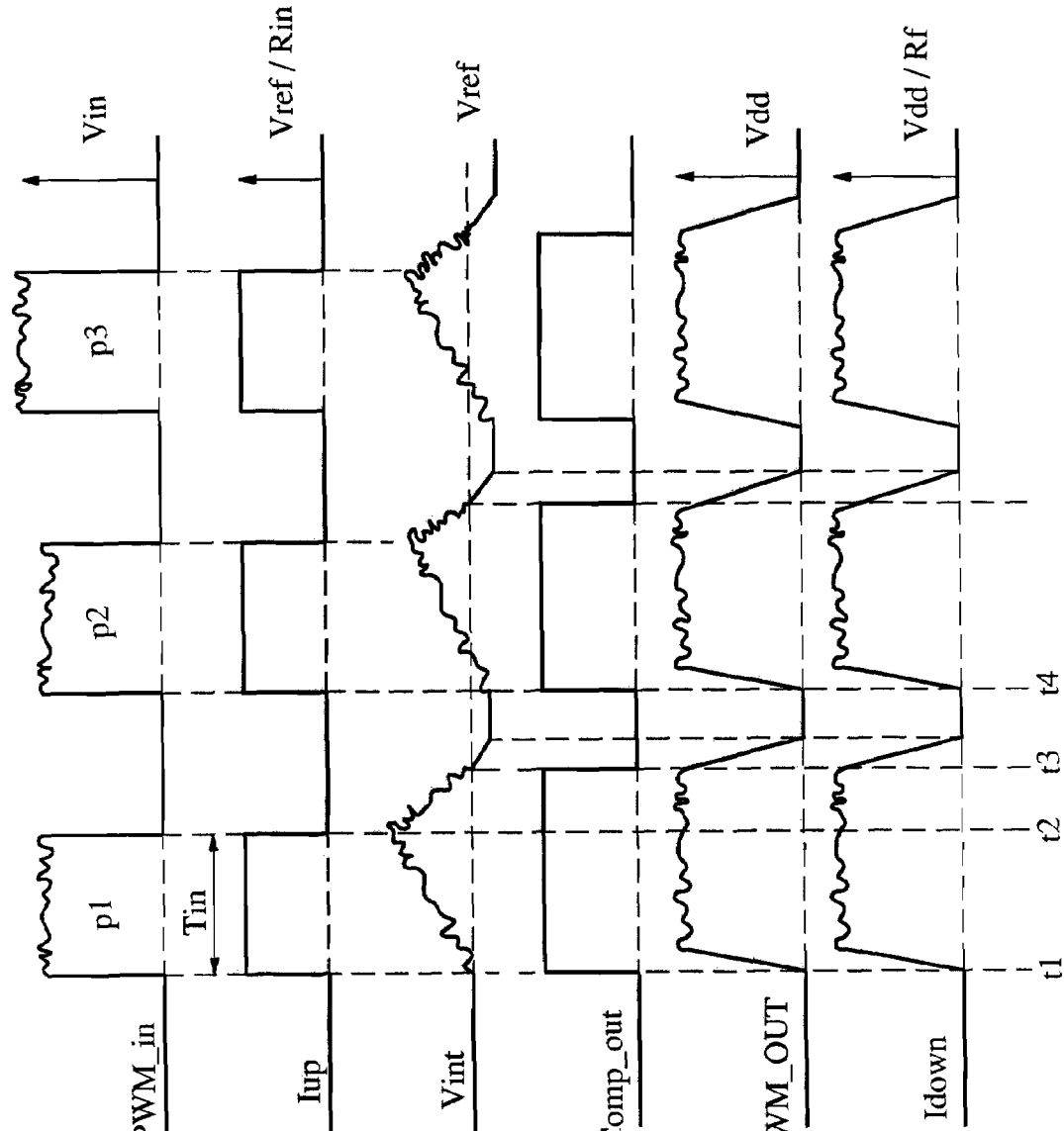
FIGS. 13A-F show timing diagrams of embodiments of signals for the circuit of FIG. 11.

FIG. 11 shows a block diagram of another embodiment of the portion (1115) of the modulator 610 of FIG. 6. Current source 1161 includes two resistors (Rf).

Unlike the embodiment of portion 915 illustrated in FIG. 9, the embodiment of portion 1115 illustrated in FIG. 11 does not have any negative voltages, and thus enables operation from a single supply voltage. The integrator is first reset so Vint=Vref. Since the integrator in this embodiment is relative to Vref instead of ground, the current Idown is (Vout−Vref)/Rf, and is accordingly compensated with an extra current Vref/Rf. This current is obtained by an extra reference voltage Vref×2 that equals 2*Vref. The operation is otherwise substantially similar to that of portion 915 of FIG. 9.

FIGS. 12A-F illustrate timing diagrams of examples of ideal signals for portion 1115 of FIG. 11.

FIGS. 13A-F show timing diagrams of embodiments of signals for portion 1115 of FIG. 11. Pulse p1 is the first pulse after resetting of the integrator. The integrator starts at Vref, without an error signal from the previous output pulse. Errors made between time t1 and t3 are corrected instantaneously (e.g., Vdd noise, turn-on delay and rise time error). At time t3, integrator voltage Vint is back at Vref and comparator output signal comp_out switches low. At that time (t3), ideally signal PWM_out would go low immediately. However, due to turn-off delay and fall time it will take some time after t3 until signal PWM_out is actually low. The result is that the first output pulse is too long. The total error from t3 to t4 is integrated and corrected for at the second output pulse. This is done by starting the integration of input pulse p2 from this integrated error signal at time t4. Each output pulse will accordingly compensate for the falltime error of its previous output pulse.

Figure 14:
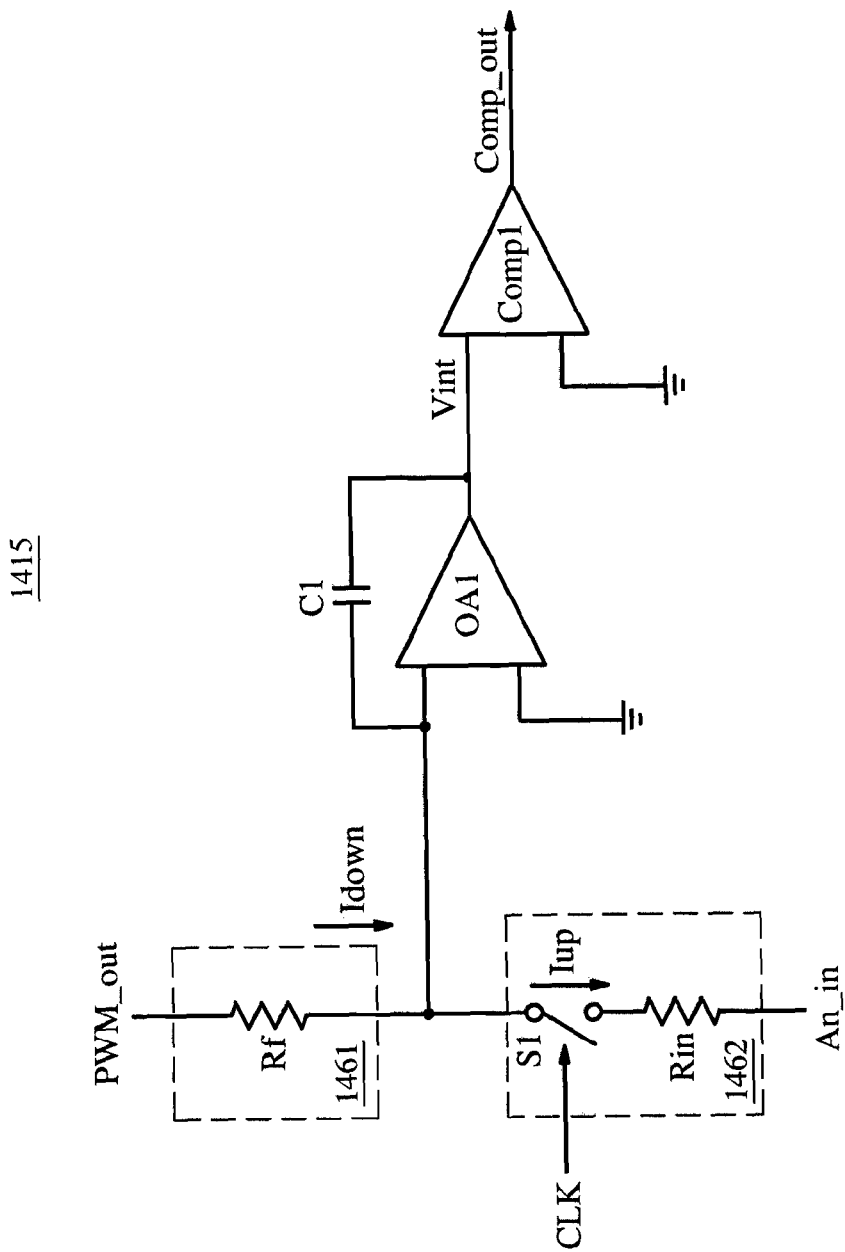
FIG. 14 illustrates a block diagram of yet another embodiment of the portion of the circuit of FIG. 6.
Figures 15A, 15B, 15C, 15D:
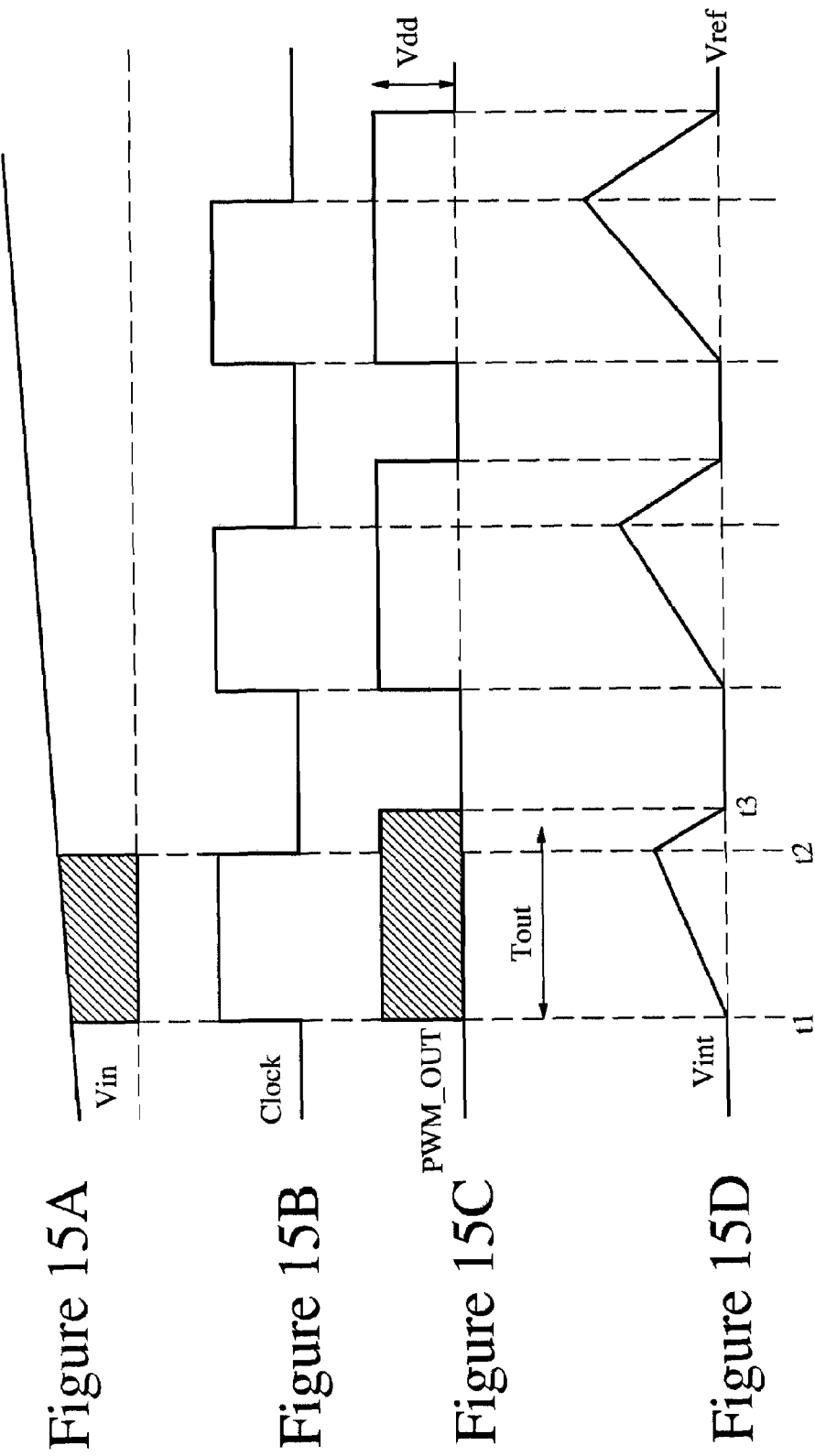
FIGS. 15A-D show timing diagrams of waveforms of embodiments of signals for an embodiment of the circuit of FIG. 14.

FIG. 14 illustrates a block diagram of an embodiment of portion 1415, which is yet another embodiment of the portion of modulator 610 of FIG. 6. Current source 1461 includes resistor Rf. Current source 1462 includes switch S1 and resistor R1.

In portion 1415, it is also possible to handle an analog input signal An_in instead of a pulse-width modulated signal. Instead of integrating a fixed reference voltage for a variable time set by the PWM input pulse, the variable input voltage is integrated for a fixed reference time. In circuit 1461, where an analog input signal is used, switch S1 opens and closes based on clock signal CLK. Accordingly, for a PWM input, an accurate and low noise voltage Vref is employed, while for an analog input, a clock signal with a constant duty-cycle is used.

FIGS. 15A-D show timing diagrams of waveforms of embodiments of signals for an embodiment of portion 1415 of FIG. 14.

Figure 16:
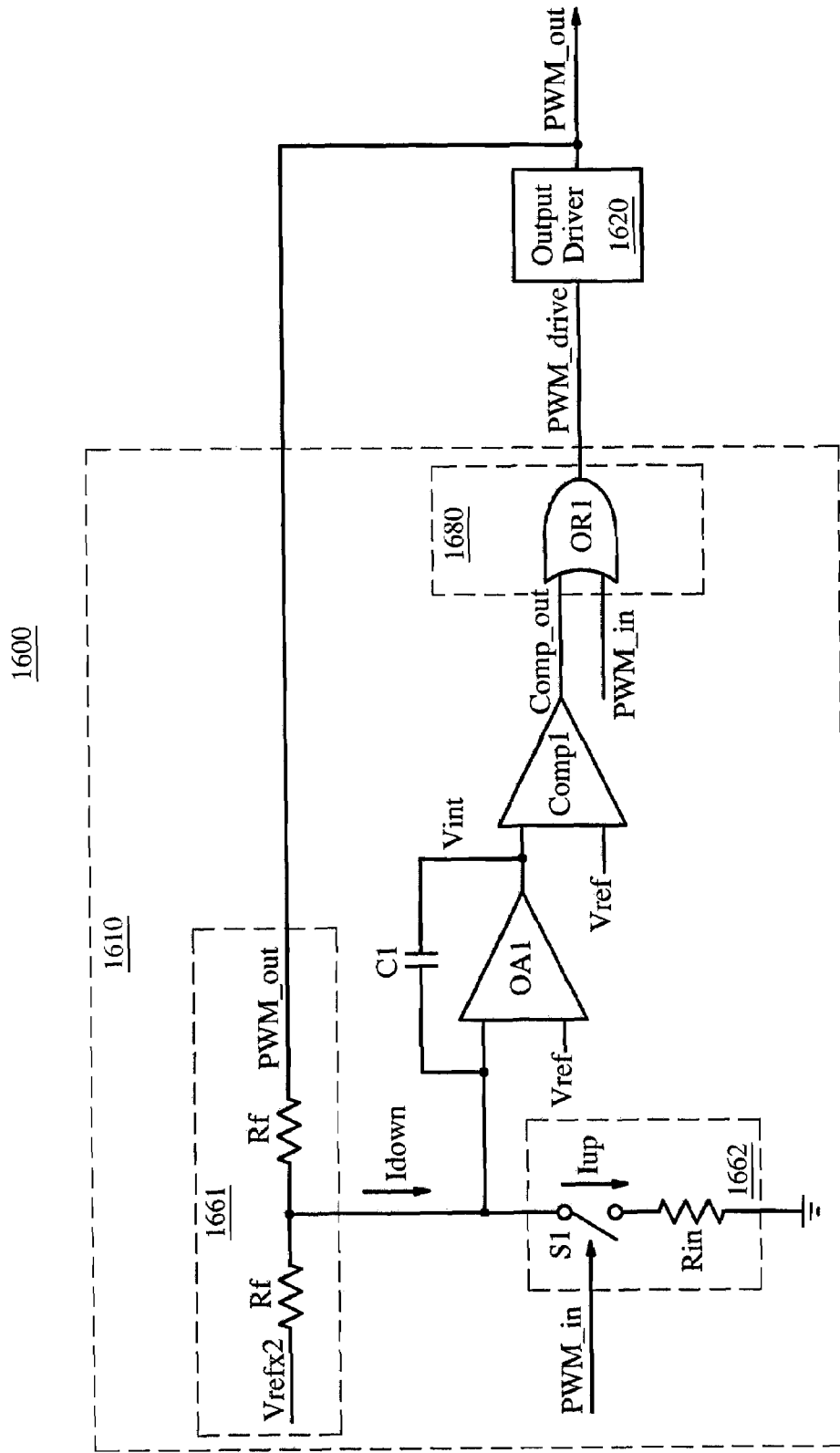
FIG. 16 illustrates a block diagram of an embodiment of the class D amplifier of FIG. 1.
Figures 17A, 17B, 17C, 17D, 17E:
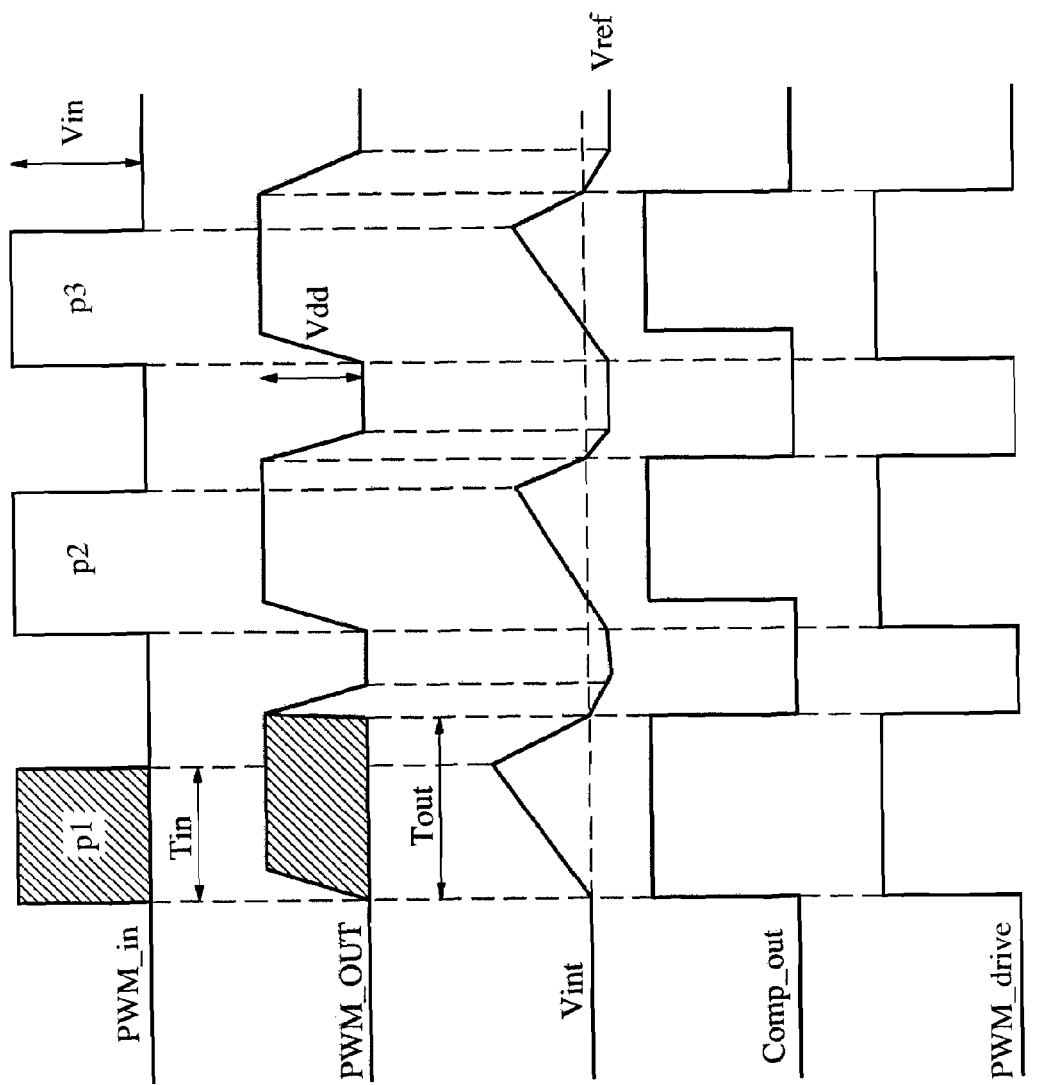
FIGS. 17A-E show timing diagrams of waveforms of embodiments of signals for an embodiment of the circuit of FIG. 16.

FIG. 16 illustrates a block diagram of an embodiment of class D amplifier 1600, which may be employed as an embodiment of class D amplifier 100 of FIG. 1, and may include an embodiment of portion 1115 of FIG. 1. Logic block 1680 includes OR gate OR1. FIGS. 17A-E show timing diagrams of waveforms of embodiments of signals for an embodiment of class D amplifier 1600 of FIG. 16.

FIG. 16 illustrates one embodiment according aspects of the invention. However, the embodiment illustrated in FIG. 16 suffers from two limitations. The first limitation is that it requires the duty-cycle of the PWM output signal to be always larger than the duty-cycle of the input PWM signal. The second limitation is that the feedback creates a closed loop that can be unstable. With the large gain, it can be difficult to guarantee stability for all conditions.

Figure 18:
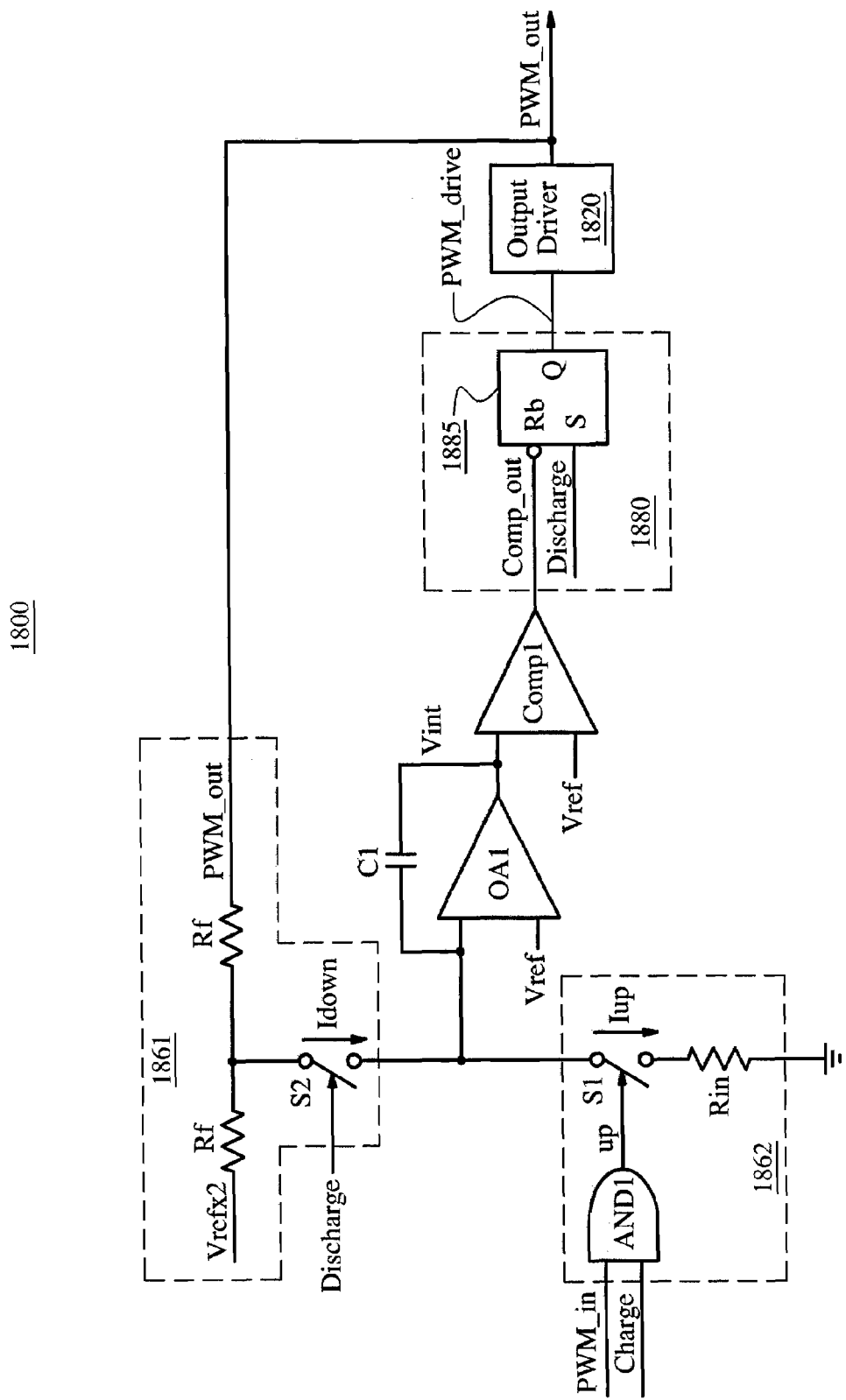
FIG. 18 illustrates a block diagram of another embodiment of the class D amplifier of FIG. 1.
Figures 19A, 19B, 19C, 19D, 19E, 19F, 19G, 19H:
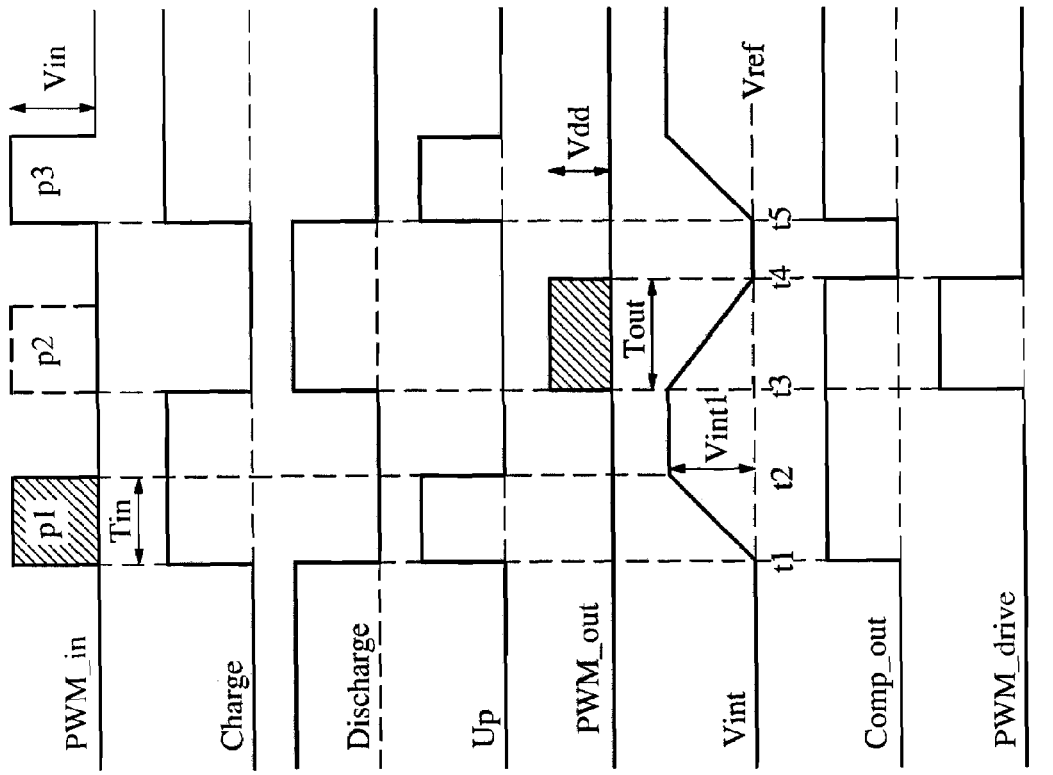
FIGS. 19A-H show timing diagrams of waveforms of examples of ideal signals for an embodiment of the circuit of FIG. 18.

FIG. 18 illustrates a block diagram of an embodiment of class D amplifier 1800, which may be employed as an embodiment of class D amplifier 100 of FIG. 1, and may include an embodiment of portion 1115 of FIG. 11. Current source 1861 further includes switch S2. Current source 1862 further includes AND gate AND1. Logic block 1880 includes RS latch 1885.

Class D amplifier 1800 has a sequence with separate time phases for handling the input and the output pulses. Signals charge and discharge are non-overlapping clock signal, where a charge phase occurs when signal charge is high and a discharge phase occurs when signal discharge is high. During the charge phase, the length of the input pulse is measured. Also, during the charge phase, the up signal can be high and the current Iup can charge the capacitor C1. The output pulse is produced during the discharge phase. During this sequence, current Idown can discharge the capacitor C1. The PWM_drive signal driving the output stage is obtained by RS latch 1885. RS latch 1885 is set at the start of the discharge phase by the rising edge of signal down, and is reset by signal comp_out going low.

Class D amplifier 1800 may be designed to handle a pulse-width modulated signal as an input as well as an analog input signal. For example, in one embodiment, a signal PWM_in may be multiplexed with constant duty cycle clock signal CLK depending on whether signal PWM_in is a pulse-width modulated signal or an analog signal. Also, in this embodiment, the bottom of resistor Rin may be (analog) multiplexed between ground and signal PWM_in depending on whether signal PWM_in is a pulse-width modulated signal or a ground signal.

FIGS. 19A-H show timing diagrams of waveforms of examples of ideal signals for an embodiment of class D amplifier 1800 of FIG. 18.

During the charge phase, the up switch is closed during the time of the incoming pulse PWM_in so current Iup is being integrated.

$$Iup = Vref/Rin$$

Vint1 is the change of integrator voltage Vint from time t1 to t2, and is a measure of the area of the input pulse p1 with a duration of Tin and an amplitude of Vref.

$$Vint1 = Iup*Tin/C1 = Vref/Rin*Tin/C1 \qquad 1)$$

At the next input pulse (p2), the discharge sequence starts. During this phase, the output pulse is produced. At the start of this pulse (t3), the output PWM_out is switched high (Vdd) by setting RS latch 1885 and current Idown is integrated. The reference voltage Vref×2 equals 2 times Vref.

$$Idown = (Vref \times 2 - Vref)/Rf + (Vdd - Vref)/Rf = Vdd/Rf$$

At time t4, the integrator voltage Vint is back at Vref so the area of the output pulse from t3 to t4 matches that of the input pulse. At that point Vint equals Vref so the comparator output comp_out switches low and resets RS latch 1885. Accordingly, the PWM_drive signal switches low and the output of the driver stage PWM_out switches low.

The change in integrator voltage between time t3 and t4 is again Vint1.

$$Vint1 = Idown*Tout/C1 = Vdd/Rf*Tout/C1 \qquad 2)$$

Combining equations 1) and 2) yields $$Vref*Tin/Rin = Vdd*Tout/Rf$$

The ratio between input and output duty-cycle is as follows.

$$Tout/Tin = Vref/Vdd*Rf/Rin$$

The gain of this circuit can be defined as the area of the output pulse divided by the duration of the corresponding input pulse.

$$Gain = Tout*Vdd/Tin = Vref*Rf/Rin$$

This shows the gain is constant, independent from the input duty-cycle and supply voltage Vdd.

The DC level at the output is defined as the average duty-cycle at the output times the supply voltage Vdd. For a constant duty-cycle:

Duty-cycle-out=$T$out/$T$in*Duty-cycle-in=$V$ref/Vdd*$R$f/$R$in*Duty-cycle-in

DC Output level=Duty-cycle-out*$V$dd=$V$ref*$R$f/$R$in*Duty-cycle-in

=Gain*Duty-cycle-in

This shows that the DC level of the output is constant for a constant input duty-cycle.

FIGS. 20A-H illustrate timing diagrams of waveforms of embodiments of signals for an embodiment of class D amplifier 1800 of FIG. 18. Again, the actual switching of the power stage is not ideal as drawn in FIGS. 19A-H. In reality the switching of the output takes some time, as shown in FIGS. 20A-H. The actual output pulse will thus be longer than it should have been. This error voltage of the output pulse is still being integrated. As a result, the next input pulse will start at Vint somewhat lower than Vref and so the next output pulse will be somewhat shorter, compensating the error of the previous output pulse. Accordingly, there is an instantaneous correction of most of the errors and a non-instantaneous correction of the falltime error that is handled at the next output pulse.

Modulator 1810 works with a charge and discharge sequence. The modulator first measures the length of the input pulse and then produces the output pulse. Modulator 1810 can therefore handle either only 50% of the input pulses or it can handle all input pulses in case the modulation depth is limited to 50%.

Figure 21:
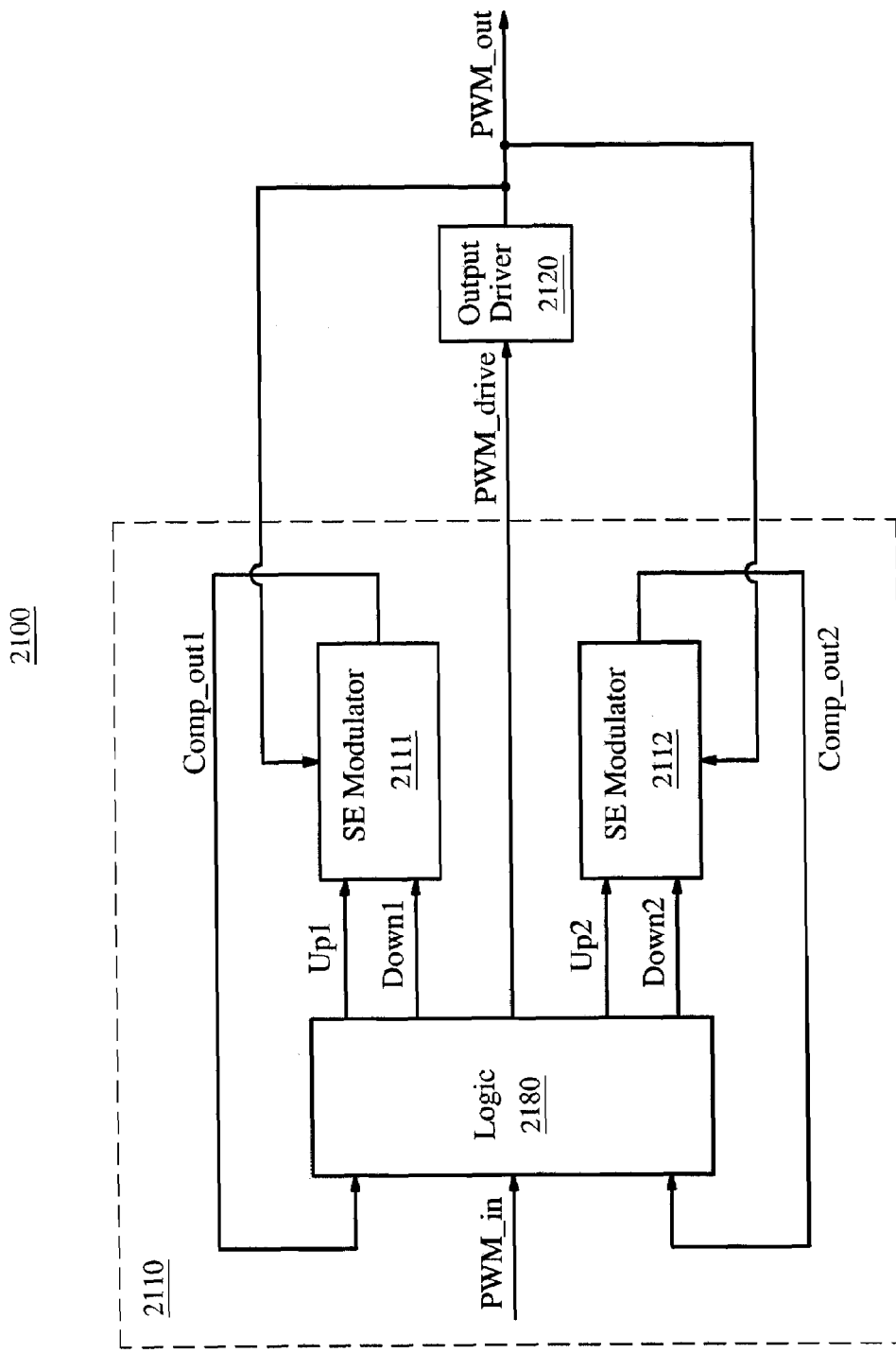
FIG. 21 shows a block diagram of a time-multiplexed single-ended embodiment of the class D amplifier of FIG. 1.

FIG. 21 shows a block diagram of class D amplifier 2100, which is a time-multiplexed single-ended embodiment of class D amplifier 100 of FIG. 1. Class D amplifier 2100 includes single-ended modulator 2111, single-ended modulator 2112, and logic block 2180. Each of the single-ended modulator may be substantially the same as any of the single-ended modulator circuit previously illustrated, such as the modulator illustrated in FIG. 18 (excluding the logic, which is instead incorporated into logic block 2180 of FIG. 21).

In Class D amplifier 2100, two single-ended modulators are employed in a time-multiplexed operation to handle all input pulses without a limitation of the duty cycle. An important advantage of having separate sequences for input and output is the guaranteed stability. The circuit can be optimized for performance and does not have to be compromised to guarantee stability.

In an embodiment that is multiplexed in time by two as shown in the embodiment illustrated in FIG. 21, the falltime error is not corrected at the next output pulse but at the output pulse after that.

Figure 22:
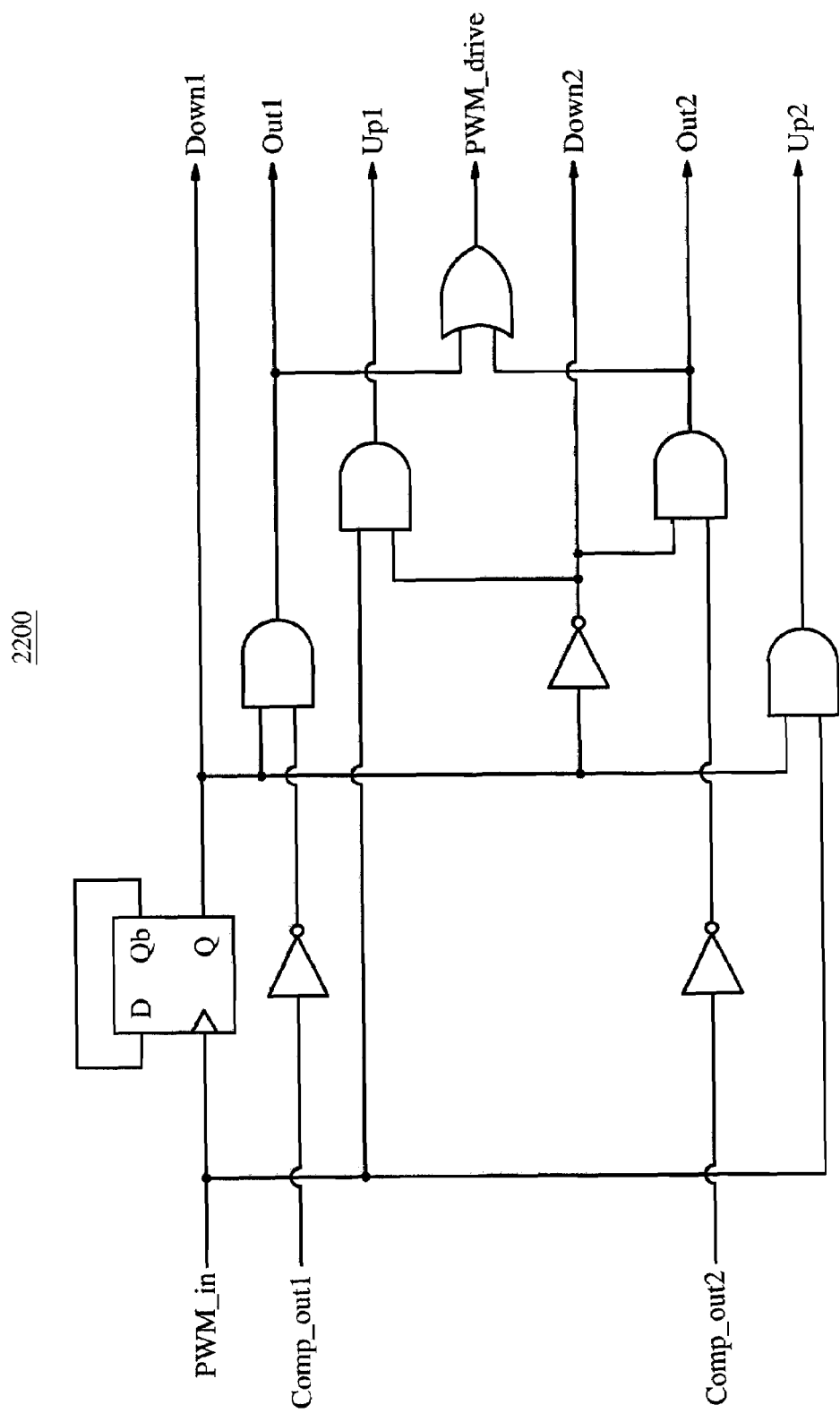
FIG. 22 illustrates a block diagram of an embodiment of the logic block of the circuit of FIG. 21.
Figure 23:
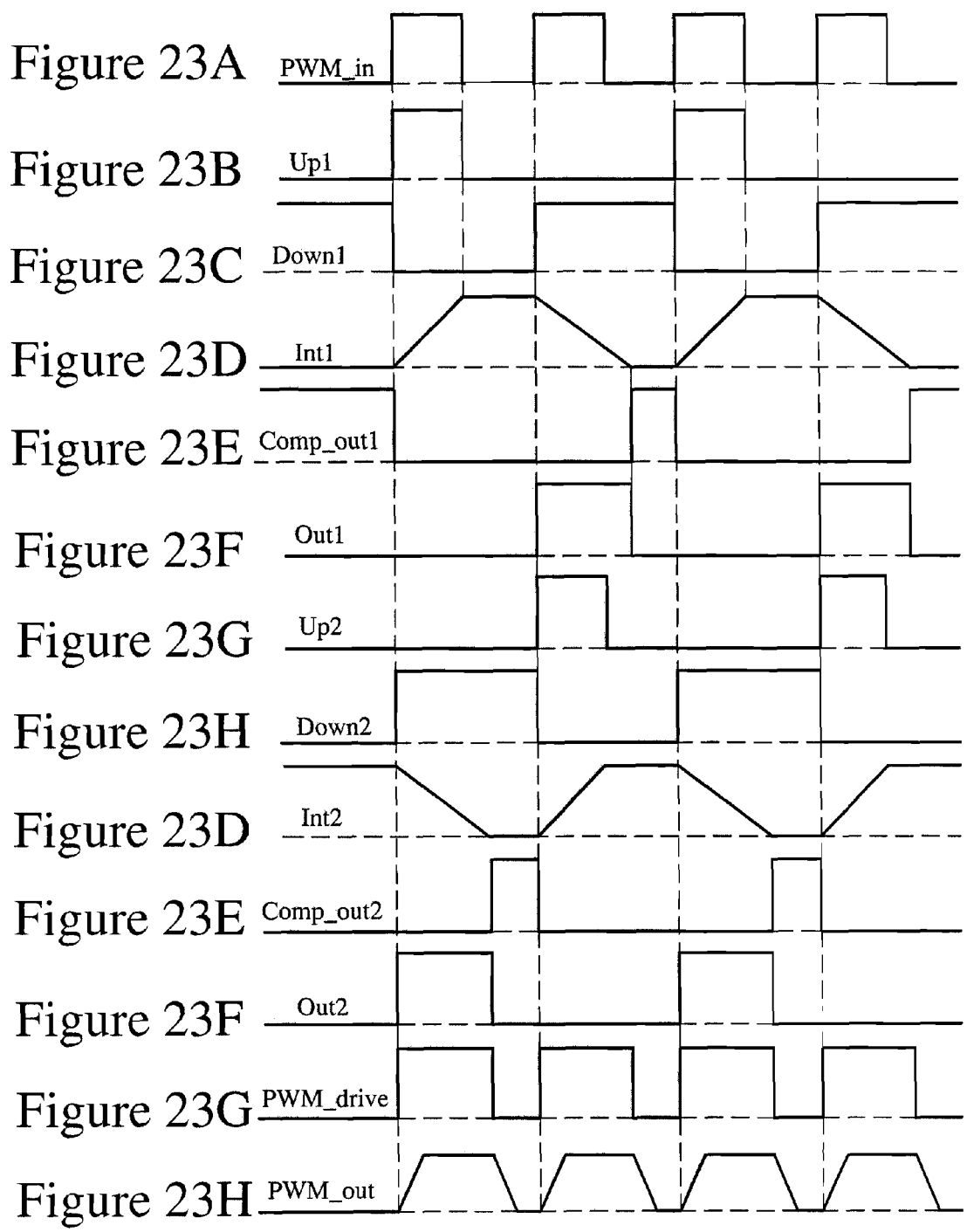
FIGS. 23A-H show timing diagrams of waveforms of embodiments of signals for the circuit of FIG. 21.

FIG. 22 illustrates a block diagram of an embodiment of logic block 2280, which may be employed as an embodiment of logic block 2180 of FIG. 21.

FIGS. 23A-H show timing diagrams of waveforms of embodiments of signals for class D amplifier 2100 circuit of FIG. 21.

Figure 24:
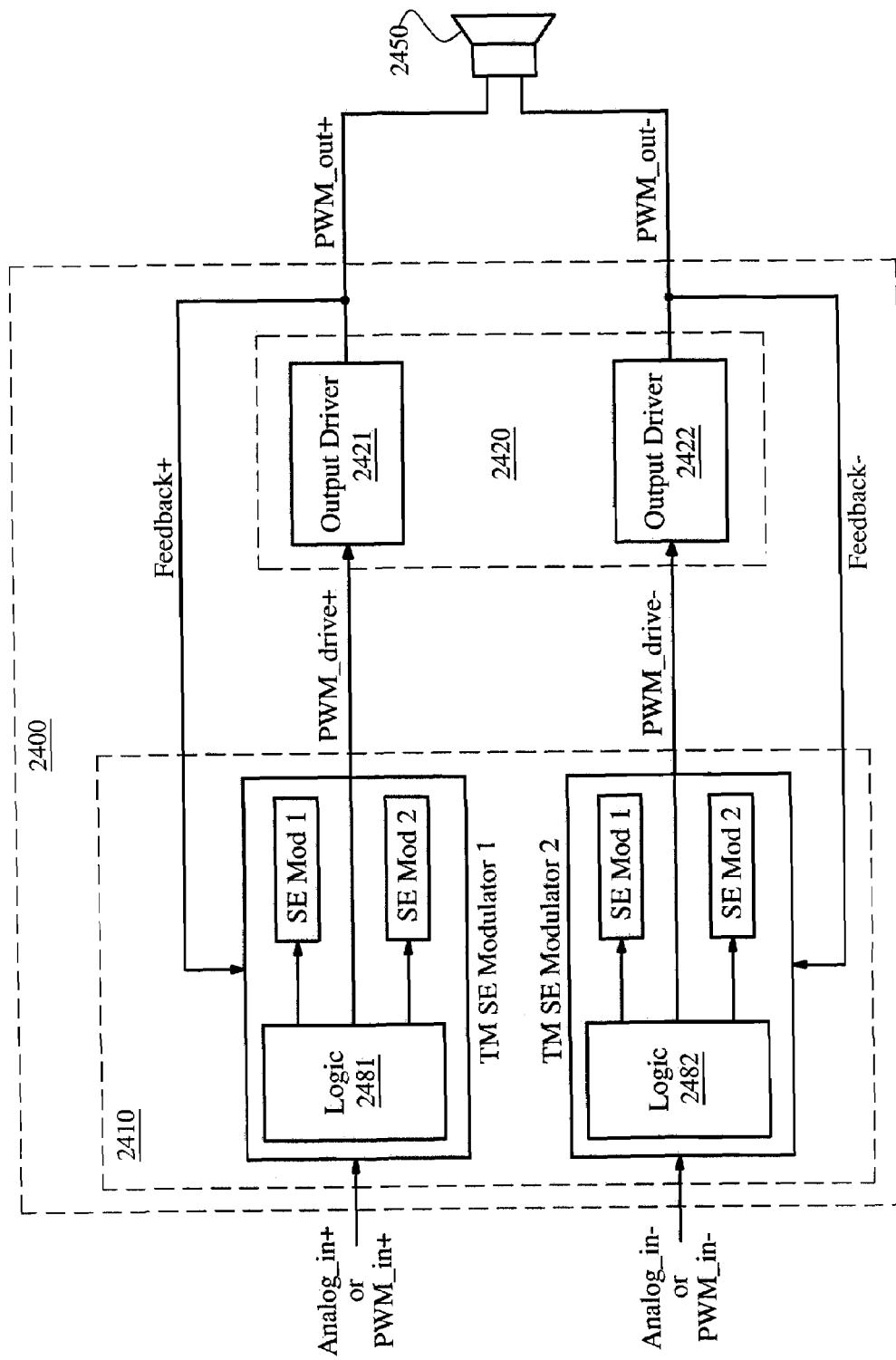
FIG. 24 illustrates an embodiment of a time-multiplexed bridge-tied-load (BTL) embodiment of the circuit of FIG. 1, arranged in accordance with aspects of the present invention.

FIG. 24 illustrates an embodiment of speaker 2450 and class D amplifier 2400, which is a time-multiplexed bridge-tied-load (BTL) embodiment of class D amplifier 100 of FIG. 1. Modulator circuit 2410 includes time-multiplexed single-ended modulator 1 and time-multiplexed single-ended modulator 2. Output driver 2420 includes output driver 2421 and output driver 2422.

In one embodiment, the audio power amplifier is built up from two substantially identical time-multiplexed (TM) single ended (SE) modulator stages in order to drive loudspeaker 2450 in bridge-tied-load (BTL) mode. Each TM SE modulator is again built up from two SE modulators and a logic block. Both TM SE modulators operate time-multiplexed.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for amplification, comprising:
a class D amplifier, including:
a modulator circuit that is arranged to provide instantaneous per-pulse feedback error correction for a PWM signal; and
a class D power stage that is coupled to the modulator circuit, wherein the instantaneous per-pulse feedback error correction means that the error correction occurs in the pulse in which the error occurs.

2. The circuit of claim 1, wherein
the modulator circuit is arranged to provide error correction such that part of the error correction is instantaneous per-pulse error correction, and such that another part of the error correction occurs on a subsequent pulse.

3. The circuit of claim 1, wherein
the modulator circuit is arranged to receive a modulator circuit input signal, and to provide a modulator circuit output signal; the class D power stage is arranged to provide a class D power stage output signal from the modulator circuit output signal; and wherein the modulator circuit is arranged to provide the modulator circuit output signal such that, for each pulse in the modulator output signal, a corresponding pulse occurs in the modulator output signal, whereby a corresponding pulse occurs in the class D power stage; and such that the corresponding pulse in the modulator output signal ends when an area under the pulse in the modulator input signal and an area under the corresponding pulse in the class D power stage output signal are substantially equal.

4. The circuit of claim 1, wherein
the modulator circuit includes a first time-multiplexed modulator such that the first time-multiplexed modulator includes a first modulator and a second modulator.

5. The circuit of claim 4, wherein
the modulator circuit further includes a second time-multiplexed modulator, and wherein the class D power stage includes a first output driver that is coupled to the first time-multiplexed modulator and a second output driver that is coupled to the second time-multiplexed modulator.

6. The circuit of claim 1, wherein
the class D power stage has at least a first output, the class D power stage is arranged to provide a first output signal at the first output, and wherein the modulator circuit includes:
a first integrator having at least an input and an output, wherein the first integrator is arranged to receive a first current that is based, in part, on the first output signal; and
a comparator having at least a first input, wherein the first input of the comparator is coupled to the output of the integrator.

7. The circuit of claim 6, wherein
the modulator circuit further includes:
- a resistive device that is coupled between the first output of the class D power stage and the input of the first integrator, wherein the modulator circuit is arranged such that the first current is based, at least in part, on a current through the resistive device.

8. The circuit of claim 6, wherein
the modulator circuit is arranged to receive a modulator circuit input signal, and wherein the modulator circuit further includes:
- a first current source having at least an output that is coupled to the input of the first integrator, wherein the first current source is arranged to provide the first current; and
- a second current source having at least an output that is coupled to the input of the first integrator, wherein the second current source is arranged to provide a second current that is based, at least in part, on the modulator circuit input signal.

9. The circuit of claim 8, wherein
the first current source includes a first resistive device that is coupled between the first output of the class D power stage and the input of the first integrator, and wherein the second current source includes a second resistive device.

10. The circuit of claim 8, wherein
the first current source further includes a first switch that is coupled between the first resistive device and the first input of the integrator, and wherein the second current source further includes a second switch that is coupled between the second resistive device and the first input of the integrator.

11. A circuit for amplification, comprising:
a class D amplifier having at least a first output, wherein the class D amplifier is arranged to provide a first output signal at the first output, and wherein the class D amplifier includes:
- a first current source that is arranged to provide a first current at the output of the current source such that the first current is based, in part, on a first output signal at the first output of the class D amplifier;
- a first integrator having at least: an output, and an input that is coupled to the output of the first current source; and
- a comparator having at least a first input, wherein the first input of the comparator is coupled to the output of the integrator, wherein
- the class D amplifier further includes a resistive device that is coupled to the input of the class D amplifier, and wherein the resistive device is arranged to provide a second current to the first input of the first integrator based, in part, on a PWM input signal.

12. The circuit of claim 11, wherein
the first current source includes a resistor that is coupled between the first output of the class D amplifier and the input of the first integrator.

13. The circuit of claim 11, wherein
the class D amplifier further includes a power stage having at least a first output, and wherein the first output of the power stage is the first output of the class D amplifier.

14. The circuit of claim 13, wherein
the class D power stage further has at least at first input, the comparator further has at least an output, the comparator is operable to provide a comparator output signal at the output of the comparator, and wherein the class D amplifier further includes:
- logic that is arranged to provide a modulator circuit output signal from the comparator output signal, wherein the class D power stage is operable to receive the modulator output signal at the input of the class D power stage.

15. A circuit for amplification, comprising:
a class D amplifier having at least a first output, wherein the class D amplifier is arranged to provide a first output signal at the first output, and wherein the class D amplifier includes:
- a first current source that is arranged to provide a first current at the output of the current source such that the first current is based, in part, on a first output signal at the first output of the class D amplifier;
- a first integrator having at least: an output, and an input that is coupled to the output of the first current source; and
- a comparator having at least a first input, wherein the first input of the comparator is coupled to the output of the integrator; the class D power stage further has at least at first input; the comparator further has at least an output; the comparator is operable to provide a comparator output signal at the output of the comparator; and wherein the class D amplifier further includes:
- logic that is arranged to provide a modulator circuit output signal from the comparator output signal, wherein the class D power stage is operable to receive the modulator output signal at the input of the class D power stage, wherein
the logic includes an OR gate having at least a first input, a second input, and an output, wherein the first input of the OR gate is coupled to the output of the comparator, and wherein the output of the OR gate is coupled to the input of the class D power stage.

16. A method for amplification, comprising:
providing a PWM output signal from a PWM input signal such that an area of each pulse of the PWM output signal is approximately the same as an area of each corresponding pulse of the PWM input signal based on instantaneous per-pulse feedback; and
driving a load based on the PWM output signal, wherein the instantaneous per-pulse feedback means that for each pulse feedback occurs in that pulse.

17. The method of claim 16, wherein
providing the PWM output signal includes:
- comparing the area of each pulse of the PWM output signal with the area of the corresponding pulse of the PWM input signal;
- ending the pulse of the PWM output signal approximately when the area of pulse of the PWM output signal reaches the area of the corresponding pulse of the PWM input signal.

18. The method of claim 17, wherein
comparing the area includes:
- providing a first current to a node at an input of an integrator, such that the first current is approximately proportional to the PWM output signal;
- providing a second current to a node at the input of the integrator, such that the second current is approximately proportional to a reference signal if the PWM input signal is a pulse-width modulated signal and the pulse-width modulated signal is asserted; and
- making a comparison based on an integrator output signal at the output of the integrator.

19. The method of claim 18, wherein
providing the first current and providing the second current is accomplished in a time-multiplexed fashion such that the first current is provided during a charge phase and the first current is substantially zero during a discharge phase, and such that the second current is provided during the discharge phase and the second current is substantially zero during the charge phase.

20. The circuit of claim 1, wherein
the modulator circuit is arranged to provide error correction such that part of the error correction is instantaneous per-pulse error correction in which the errors corrected by instantaneous per-pulse error correction are corrected in the pulse of the PWM signal in which the errors corrected by per-pulse instantaneous error correction occur; and such that another part of the error correction occurs on a subsequent pulse to the pulse of the PWM signal in which the errors corrected occur.

21. The circuit of claim 15, wherein
the class D amplifier further includes a resistive device that is coupled to the input of the class D amplifier, and wherein the resistive device is arranged to provide a second current to the first input of the first integrator based, in part, on a PWM input signal.

\* \* \* \* \*

UNITED STATES PATENT AND TRADEMARK OFFICE
CERTIFICATE OF CORRECTION

PATENT NO. : 7,518,442 B1
APPLICATION NO. : 11/548240
DATED : April 14, 2009
INVENTOR(S) : Gerrit Dijkstra et al.

It is certified that error appears in the above-identified patent and that said Letters Patent is hereby corrected as shown below:

In column 7, line 45, delete "FIG. 1." and insert -- FIG. 11. --, therefor.

Signed and Sealed this

Eighteenth Day of August, 2009

David J. Kappos
*Director of the United States Patent and Trademark Office*